(12) United States Patent
Chen et al.

(10) Patent No.: US 7,763,942 B2
(45) Date of Patent: Jul. 27, 2010

(54) PIXEL STRUCTURE

(75) Inventors: Ming-Yan Chen, Hsinchu (TW); Yi-Wei Chen, Hsinchu (TW); Yi-Sheng Cheng, Hsinchu (TW); Ying-Chi Liao, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 447 days.

(21) Appl. No.: 11/851,392

(22) Filed: Sep. 7, 2007

(65) Prior Publication Data
US 2009/0001377 A1 Jan. 1, 2009

(30) Foreign Application Priority Data
Jun. 29, 2007 (TW) .................... 96123782

(51) Int. Cl.
H01L 23/62 (2006.01)
H01L 21/8238 (2006.01)
G02F 1/1343 (2006.01)
(52) U.S. Cl. ............................ 257/359; 438/211; 349/39
(58) Field of Classification Search ................. 257/290, 257/359, 377; 438/201, 211; 349/39, 47
See application file for complete search history.

(56) References Cited

U.S. PATENT DOCUMENTS
7,218,361 B2 * 5/2007 Yamazaki et al. ............. 349/43

7,498,210 B2 * 3/2009 Cheng ........................ 438/155

FOREIGN PATENT DOCUMENTS

| CN | 1971388 | 5/2007 |
| JP | 08-271929 | 10/1996 |
| TW | 465117 | 11/2001 |
| TW | 494580 | 7/2002 |

* cited by examiner

Primary Examiner—Calvin Lee
(74) Attorney, Agent, or Firm—Jianq Chyun IP Office

(57) ABSTRACT

A pixel structure and a fabrication method thereof are provided, wherein a semiconductor pattern and a data line are defined simultaneously by performing a half-tone or grey-tone masking process. In addition, a self-alignment manner is further adopted to fabricate a lightly doped region with symmetric lengths on two sides of a channel region through steps such as photoresist ashing and etching, so as to prevent the problem of misalignment of mask generated when a mask is used to define the lightly doped region in the conventional art. Furthermore, a source pattern and a drain pattern are made to directly contact a source region and a drain region of the semiconductor pattern, such that a process of fabricating a via is omitted. Besides, in the present invention, a common line pattern surrounding the peripheral of the pixel region is also formed to improve the aperture ratio of the pixel structure.

11 Claims, 23 Drawing Sheets

A-A'

B-B'

A-A'

B-B'

A-A'

B-B'

A-A'

B-B'

A-A'

B-B'

A-A'

A-A'

PIXEL STRUCTURE

CROSS-REFERENCE TO RELATED APPLICATION

This application claims the priority benefit of Taiwan application Ser. No. 96123782, filed Jun. 29, 2007. All disclosure of the Taiwan application is incorporated herein by reference.

BACKGROUND OF THE INVENTION

1. Field of the Invention

The present invention relates to a pixel structure and a fabrication method thereof. More particularly, the present invention relates to a pixel structure applying a low temperature poly-silicon thin film transistor (LTPS TFT) and a fabrication method thereof.

2. Description of Related Art

Early fabrication of poly-silicon thin film transistor (poly-silicon TFT) adopts a solid phase crystallization (SPC) process, and a process temperature is up to 1000° C., so it is necessary to adopt a quartz substrate having a relatively high melting point. In addition, because the cost of the quartz substrate is much more expensive than that of the glass substrate, and under the situation that the size of the substrate is limited, only small-sized panel (approximately only 2 to 3 inches) can be developed in the past. Recently, as the laser technology continuously develops, excimer laser annealing (ELA) process is introduced into the poly-silicon TFT process.

The ELA process mainly uses the laser beam to irradiate an amorphous silicon layer (a-Si layer), such that the a-Si layer is recrystallized after melting to form a poly-silicon layer. All the processes of the poly-silicon TFT process adopting the ELA process can be finished under a temperature of 600° C., so the poly-silicon TFT formed by the process is also referred to as a low temperature poly-silicon TFT (LTPS TFT).

FIG. 1 is a conventional pixel structure 100 applying the LTPS TFT. In the pixel structure 100, a poly-silicon pattern 112 and a poly-silicon pattern 114 are formed on a glass substrate 102, and the poly-silicon pattern 112 includes a source region 112$s$, a drain region 112$d$, a channel region 112$c$, and a lightly doped region 112$k$ located between the source region 112$s$ and the channel region 112$c$ and between the drain region 112$d$ and the channel region 112$c$. A gate insulation layer 120 covers the poly-silicon pattern 112 and the poly-silicon pattern 114, and a gate pattern 132 and a lower electrode pattern 134 are located on the gate insulation layer 120 and respectively correspond to the above of the poly-silicon pattern 112 and the poly-silicon pattern 114. A protective layer 140 covers the gate pattern 132 and the lower electrode pattern 134, and a source pattern 152$a$ and a drain pattern 152$b$ are located on the protective layer 140, and are respectively connected to the source region 112$s$ and the drain region 112$d$ of the poly-silicon pattern 112 through the protective layer 140 and the gate insulation layer 120. In addition, an upper electrode pattern 154 is also disposed on the protective layer 140, and corresponds to the lower electrode pattern 134. A planarization layer 160 covers the source pattern 152$a$, the drain pattern 152$b$, and the upper electrode pattern 154, and the planarization layer 160 has a contact window 162. The pixel electrode 170 is located on the planarization layer 160, and is connected to the drain pattern 152$b$ through the contact window 162.

However, the fabricating process of the aforementioned conventional pixel structure as shown in FIG. 1 is relatively complicated. Generally, six or more mask processes are required to form the pixel structure. In addition, the poly-silicon pattern 114, the gate insulation layer 120, the lower electrode pattern 134, the protective layer 140, and the upper electrode pattern 154 in FIG. 1 can form a storage capacitor. Nevertheless, the poly-silicon pattern 114 is shielded by the lower electrode pattern 134 and can not be doped in the doping process of forming the source region 112$s$ and the drain region 112$d$, which leads to a poor conductive characteristic of the poly-silicon pattern 114 and restricts the design of the storage capacitor.

SUMMARY OF THE INVENTION

Accordingly, the present invention is directed to a pixel structure, which has a preferred storage capacitor design and a relatively simple process, so as to reduce the production cost.

The present invention is further directed to a fabrication method of a pixel structure, which has relatively simplified processing steps, and is capable of fabricating the pixel structure having favorable characteristics.

In order to give a detailed description of the content of the present invention, a fabrication method of a pixel structure is provided herein. Firstly, a substrate is provided, and a semiconductor layer and a first conductive layer are formed on the substrate in sequence. Next, the semiconductor layer and the first conductive layer are patterned to form a semiconductor pattern and a data line pattern, wherein the semiconductor pattern is composed of the semiconductor layer, and the data line pattern is composed of the semiconductor layer and the first conductive layer. Then, a gate insulation layer and a second conductive layer are formed on the substrate in sequence, and the gate insulation layer and the second conductive layer are patterned to form a gate pattern and a scan line pattern connected to each other. The gate pattern is composed of the gate insulation layer and the second conductive layer, wherein the gate pattern is located on the semiconductor pattern, and exposes a portion of the semiconductor pattern, and the exposed portion of the semiconductor pattern is located on two sides of the gate pattern. Then, a source region, a drain region, a channel region, and a lightly doped region are formed in the semiconductor pattern, wherein the source region and the drain region are respectively located on two sides of the gate pattern, the channel region is located under the gate pattern, and the lightly doped region is located between the channel region and the source region and between the channel region and the drain region. Next, a third conductive layer is formed on the substrate, and then the third conductive layer is patterned to form a source pattern and a drain pattern, wherein the source pattern and the drain pattern are respectively located on two sides of the gate pattern, and are respectively connected to the source region and the drain region, and the source pattern is further electrically connected to the data line pattern. Next, a protective layer is fully formed on the substrate. Then, the protective layer is patterned to form a contact window to expose the drain pattern. Finally, a pixel electrode electrically connected to the drain pattern through the contact window is formed on the protective layer.

In an embodiment of the present invention, the step of patterning the semiconductor layer and the first conductive layer includes forming a photoresist material layer on the first conductive layer, and patterning the photoresist material layer to form a first photoresist pattern and a second photoresist pattern, wherein the first photoresist pattern corresponds to a position of the subsequently formed semiconductor pattern, the second photoresist pattern corresponds to a position of the subsequently formed data line pattern, and a thickness of the first photoresist pattern is smaller than that of the second photoresist pattern. Then, the semiconductor layer and the first conductive layer are etched by using the first photoresist pattern and the second photoresist pattern as a mask, so as to remove the first conductive layer and the semiconductor layer exposed by the first photoresist pattern and the second photoresist pattern. Next, an ashing process is performed on the first photoresist pattern and the second photoresist pattern, so as to fully remove the first photoresist pattern and to remove a portion of the second photoresist pattern. Then, the semiconductor layer and the first conductive layer are etched by using the remained second photoresist pattern as a mask, so as to remove the first conductive layer exposed by the second photoresist pattern. Finally, the remained second photoresist pattern is removed.

In an embodiment of the present invention, the step of patterning the photoresist material layer includes performing a lithography process on the photoresist material layer through a half-tone mask or a grey-tone mask.

In an embodiment of the present invention, the step of forming the source region, the drain region, the channel region, and the lightly doped region includes leaving a photoresist pattern on the gate pattern after patterning the gate insulation layer and the second conductive layer. Then, a first ion doping is performed on the semiconductor pattern by using the photoresist pattern and the gate pattern as a mask, so as to form the source region and the drain region. Then, an ashing process is performed on the photoresist pattern to remove a portion of the photoresist pattern, such that the photoresist pattern exposes a portion of the gate pattern. Then, the exposed gate pattern is etched by using the ashed photoresist pattern as a mask, such that the gate pattern further exposes the other part of the semiconductor pattern. Then, a second ion doping is performed on the other part of the semiconductor pattern exposed by the gate pattern by using the gate pattern as a mask, and the second ion doping is a light ion doping, so as to form the lightly doped region. Finally, the photoresist pattern is removed. The first ion doping and the second ion doping are an N-type doping or a P-type doping.

In an embodiment of the present invention, the fabrication method of the pixel structure further includes patterning the gate insulation layer and the second conductive layer, so as to form a first electrode pattern on the data line pattern. In addition, the third conductive layer can be further patterned to form a common line pattern, and a portion of the common line pattern is located on the first electrode pattern.

In an embodiment of the present invention, the fabrication method of the pixel structure further includes patterning the semiconductor layer and the first conductive layer, so as to form a first electrode pattern. In addition, the gate insulation layer and the second conductive layer can be further patterned to form a common line pattern, wherein a portion of the common line pattern is located on the first electrode pattern. In addition, the drain pattern can be electrically connected to the first electrode pattern.

In an embodiment of the present invention, the thickness of the gate insulation layer is approximately 500 Å to 1500 Å.

In an embodiment of the present invention, the material of the second conductive layer includes aluminum, titanium/aluminum/titanium, titanium/molybdenum/titanium, molybdenum, molybdenum/aluminum/molybdenum, moly-tungsten, or a combination thereof.

In an embodiment of the present invention, the material of the third conductive layer includes molybdenum, molybdenum/aluminum/molybdenum, aluminum, titanium/aluminum/titanium, or a combination thereof.

In an embodiment of the present invention, the material of the protective layer can be silica, silicon nitride, or a combination thereof. In addition, the thickness of the protective layer is approximately 2000 Å to 8000 Å, or approximately 2000 Å to 6000 Å preferably.

The present invention provides a pixel structure, which mainly includes a substrate, a semiconductor pattern, a data line, a scan line, a gate pattern, a gate insulation layer, a source pattern, a drain pattern, a protective layer, and a pixel electrode. The semiconductor pattern and the data line are formed on the substrate, and the semiconductor pattern has a source region, a drain region, a channel region, and a lightly doped region, wherein the source region and the drain region are respectively located on two sides of the channel region, and the lightly doped region is located between the channel region and the source region and between the channel region and the drain region. The scan line is formed on the substrate, and located above the data line. In addition, the gate pattern is formed on the semiconductor pattern, and electrically connected to the scan line. The gate insulation layer is located between the gate pattern and the semiconductor pattern. In addition, the source pattern and the drain pattern are respectively disposed on two sides of the gate pattern, and respectively electrically connected to the source region and the drain region, and the source pattern is further electrically connected to the data line. The protective layer is disposed on the substrate to cover the semiconductor pattern, the data line, the scan line, the gate pattern, the source pattern, and the drain pattern, and has a contact window for exposing the drain pattern. The pixel electrode is disposed on the protective layer, and electrically connected to the drain pattern through the contact window.

In an embodiment of the present invention, the material of the semiconductor pattern includes poly-silicon.

In an embodiment of the present invention, the material of the scan line, the gate pattern, the source pattern, and the drain pattern includes metal.

In an embodiment of the present invention, the source region and the drain region can be an N-type doped region or a P-type doped region.

In an embodiment of the present invention, the lightly doped region can be an N-type doped region or a P-type doped region.

In an embodiment of the present invention, the pixel structure further includes a first electrode pattern located on the data line. In addition, the pixel structure can further include a common line pattern, wherein a portion of the common line pattern is located on the first electrode pattern. The common line pattern is, for example, located on a peripheral region of the pixel electrode.

In an embodiment of the present invention, the pixel structure further includes a first electrode pattern located on a display region of the pixel electrode. In addition, the pixel structure further includes a common line pattern, wherein a portion of the common line pattern is located on the first electrode pattern. In addition, the drain pattern can be electrically connected to the first electrode pattern.

In an embodiment of the present invention, the thickness of the gate insulation layer is approximately 500 Å to 1500 Å.

In an embodiment of the present invention, the material of the gate pattern includes aluminum, titanium/aluminum/titanium, titanium/molybdenum/titanium, molybdenum, molybdenum/aluminum/molybdenum, moly-tungsten, or a combination thereof.

In an embodiment of the present invention, the material of the source pattern and the drain pattern includes molybdenum, molybdenum/aluminum/molybdenum, titanium/aluminum/titanium, or a combination thereof.

In an embodiment of the present invention, the thickness of the protective layer is approximately 2000 Å to 8000 Å, or approximately 2000 Å to 6000 Å preferably.

The fabrication method of the pixel structure of the present invention can use a half-tone mask or a grey-tone mask process technique to simultaneously define the semiconductor pattern and the data line. In addition, the fabrication method of the pixel structure of the present invention can further adopt a self-alignment method to fabricate the lightly doped region having symmetric lengths on two sides of the channel region through steps such as photoresist ashing and etching, so as to effectively avoid the problem of the misalignment of the mask when defining the lightly doped region in the conventional art. In addition, the source pattern and the drain pattern are directly contacted with the source region and the drain region of the semiconductor pattern in the present invention, such that a process of fabricating via can be omitted. Furthermore, the common line pattern can be fabricated in surrounding the peripheral of the pixel region in the present invention, thereby improving an aperture ratio of the pixel structure.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a portion of this specification. The drawings illustrate embodiments of the invention and, together with the description, serve to explain the principles of the invention.

DESCRIPTION OF EMBODIMENTS

Figure 1:
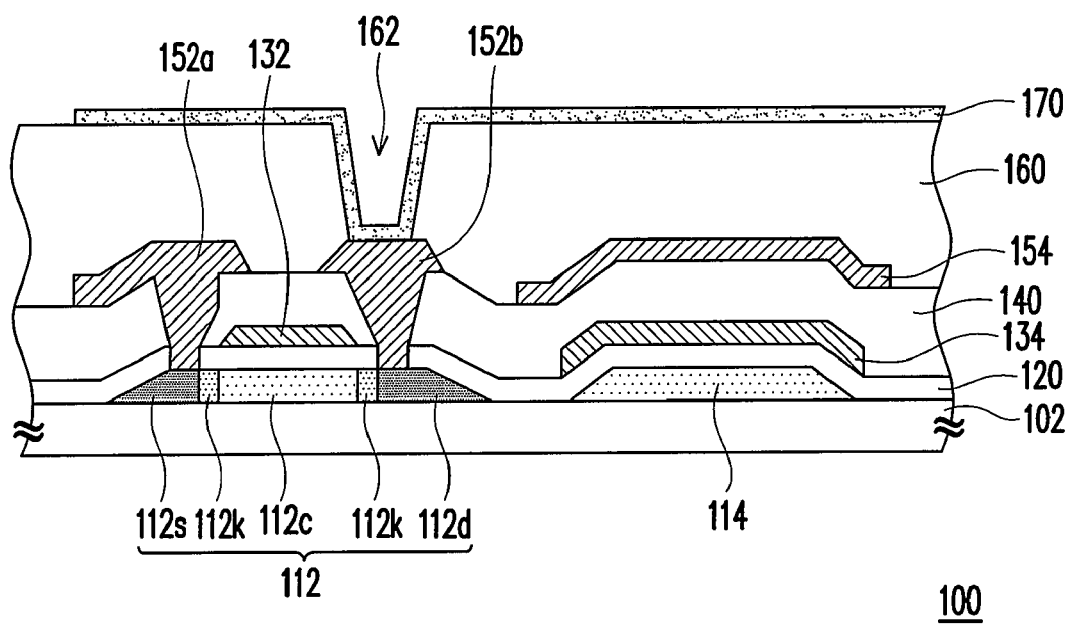
FIG. 1 is a conventional pixel structure applying an LTPS TFT.

In the following, two embodiments are given to illustrate the pixel structure and the fabrication method thereof provided by the present invention. The main difference between the two embodiments is that the positions and the forming methods of the storage capacitor are different, but the two embodiments similarly have advantages that, for example, the process is simple, and the misalignment of the mask when the lightly doped region is defined can be avoided etc. The storage capacitor of the first embodiment is disposed to surround the peripheral of the pixel region, and the storage capacitor of the second embodiment is located in the pixel region. Definitely, the embodiments as follows are only used for exemplification, the position and the structure of the storage capacitor are not limited to the following methods, and the possible methods of forming each film layer in the pixel structure are also not limited to the methods referred in the embodiments as follows. Those skilled in the art can adjust position, material, or forming method of each film layer in the pixel structure within a reasonable scope after referring to the content disclosed by the present invention, so as to satisfy the practical requirement.

First Embodiment

FIGS. 2A to 2K illustrate a fabrication method of a pixel structure according to the first embodiment of the present invention. Each drawing shows a top view, a sectional view along line A-A', and a section view along line B-B' of the related structure. Under the possible situation, in order to clearly represent the content of the drawing, the numerals in the top views of FIGS. 2A to 2K are used to mark the patterns defined in the process, and the numerals in the sectional views of FIGS. 2A to 2K are used to mark the material film layers forming the patterns.

Figure 2A:
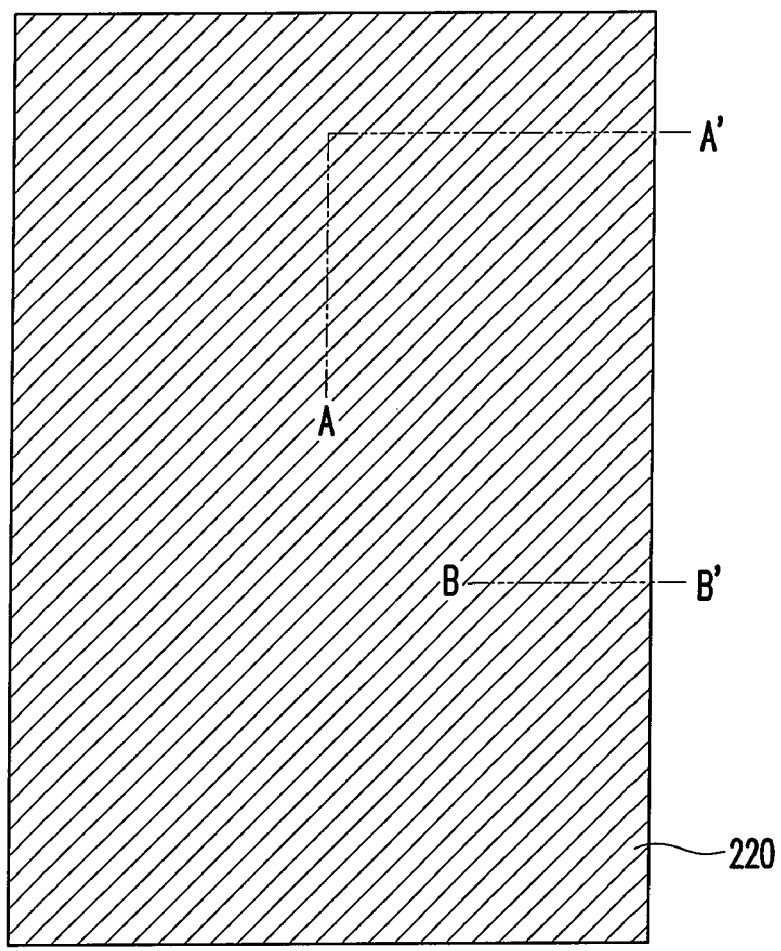
FIGS. 2A to 2K illustrate a fabrication method of a pixel structure according to a first embodiment of the present invention.
Figure 2A:
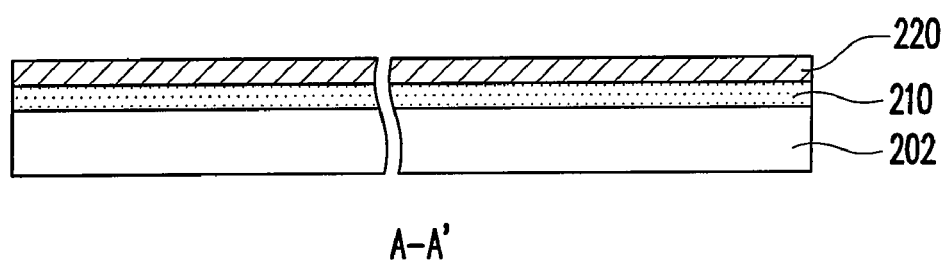
Figure 2A:
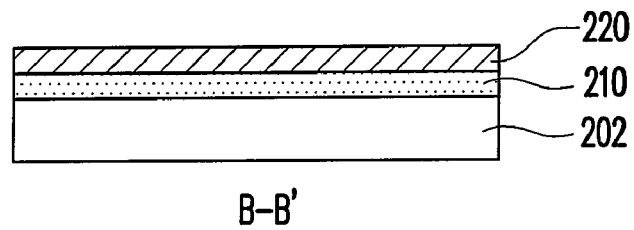

Firstly, as shown in FIG. 2A, a substrate 202 is provided, and a semiconductor layer 210 and a first conductive layer 220 are formed on the substrate 202 in sequence. Here, the semiconductor layer 210 is, for example, a poly-silicon layer, and the material of the first conductive layer 220 includes molybdenum, molybdenum/aluminum/molybdenum, titanium/aluminum/titanium, or a combination thereof.

Then, as shown in FIGS. 2B-2E, the semiconductor layer 210 and the first conductive layer 220 are patterned to form a semiconductor pattern 272 and a data line pattern 274 having different thicknesses, wherein the semiconductor pattern 272 is composed of the semiconductor layer 210, and the data line pattern 274 is composed of the semiconductor layer 210 and the first conductive layer 220.

Figure 2B:
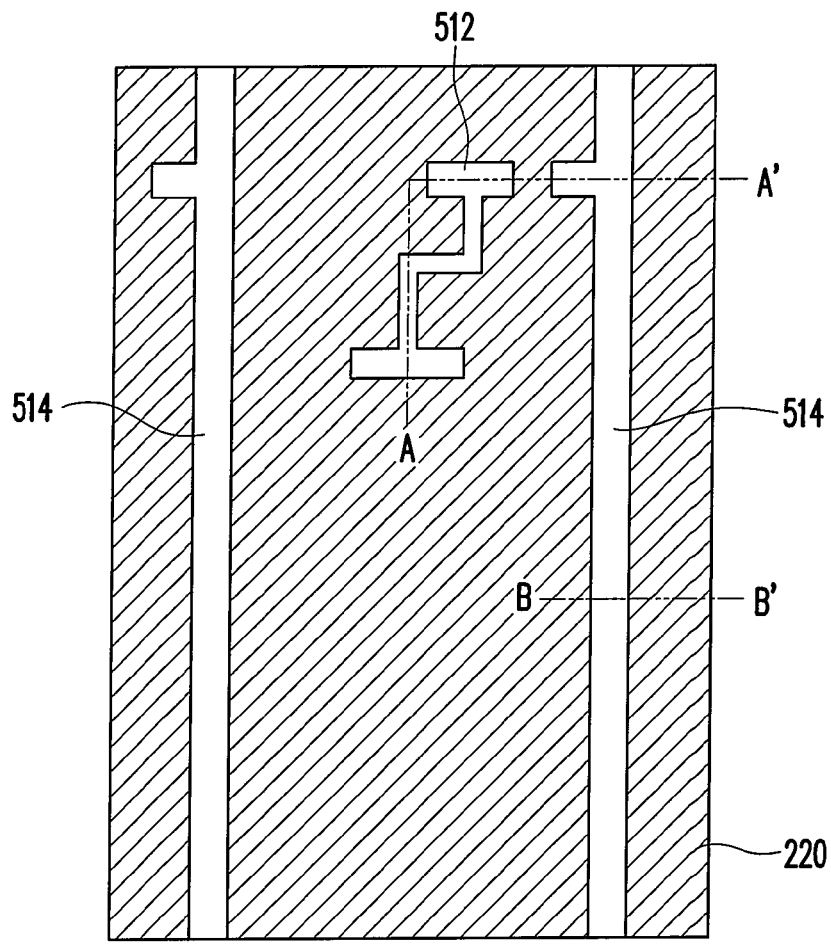
Figure 2B:
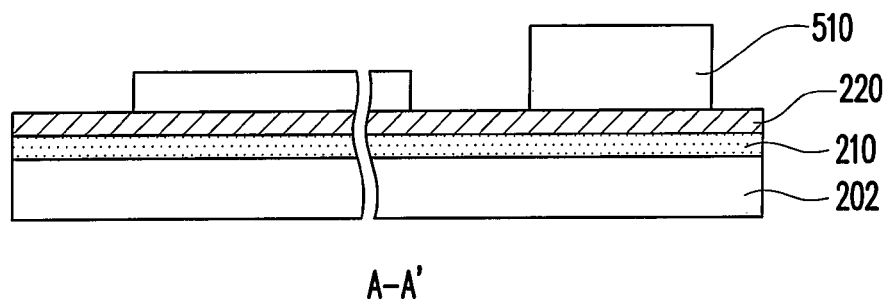
Figure 2B:
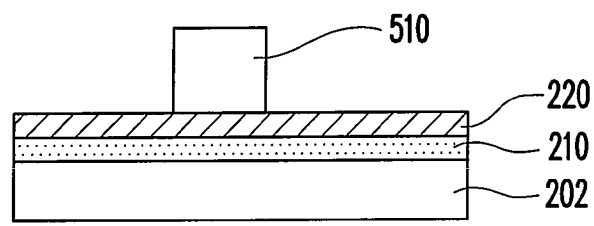
Figure 2C:
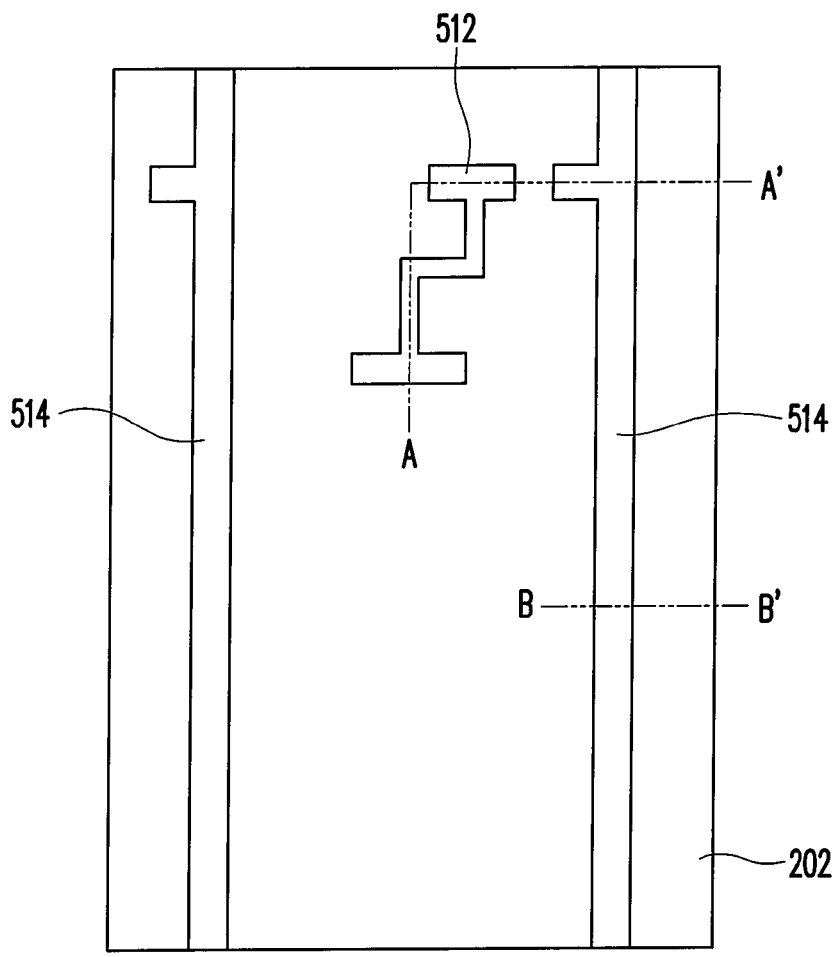
Figure 2C:
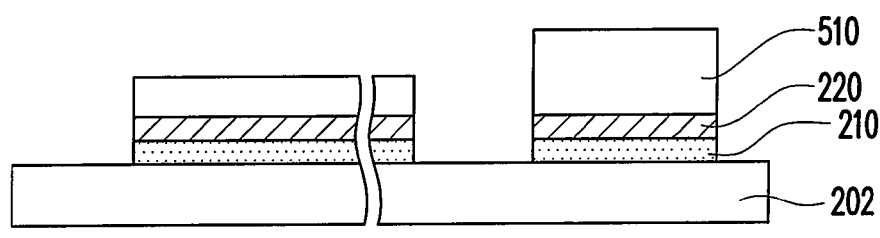
Figure 2C:
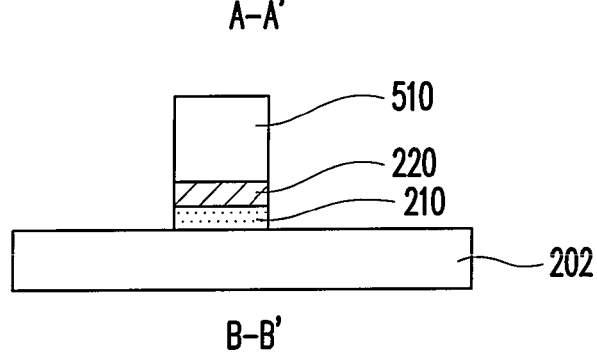
Figure 2D:
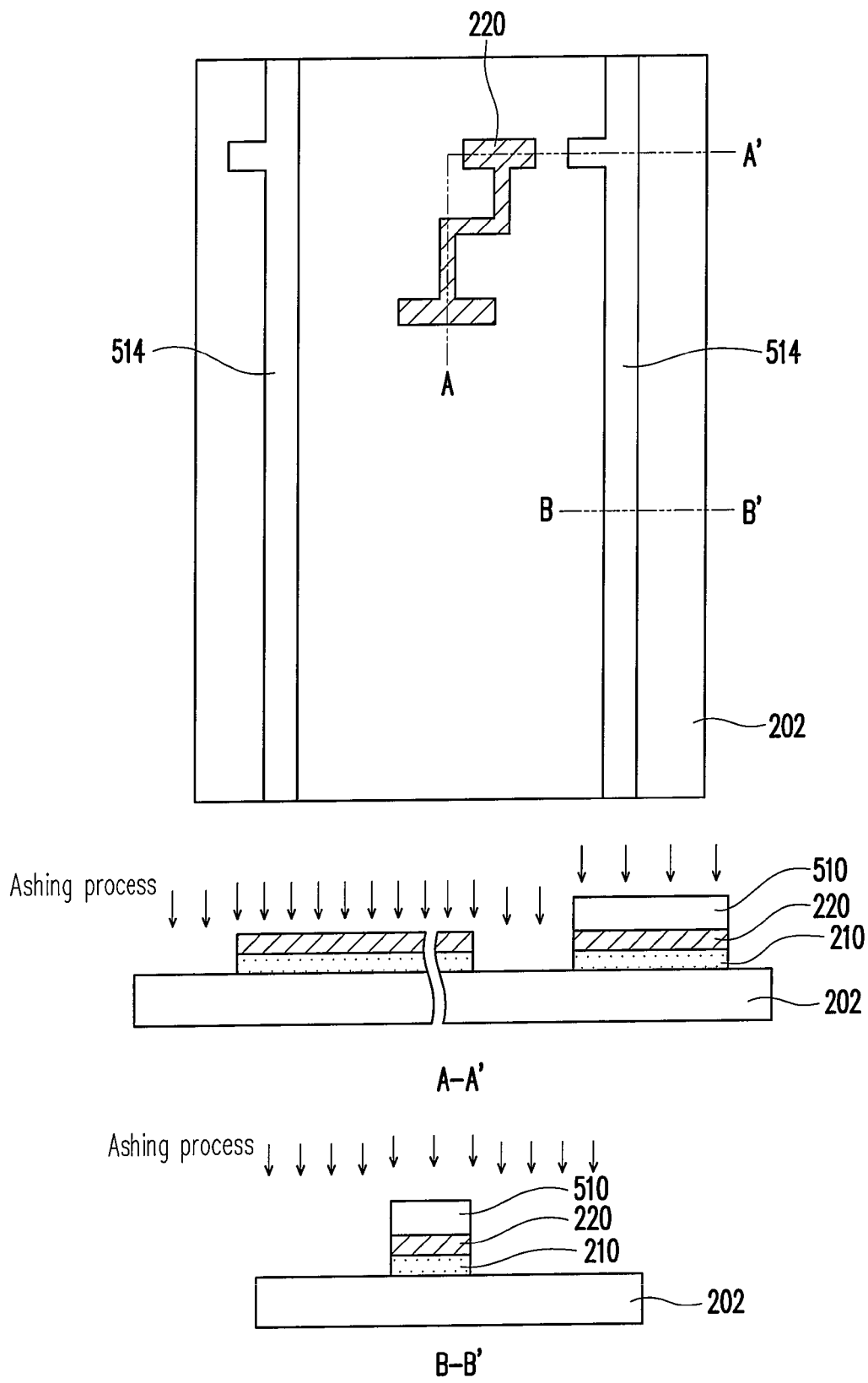
Figure 2E:
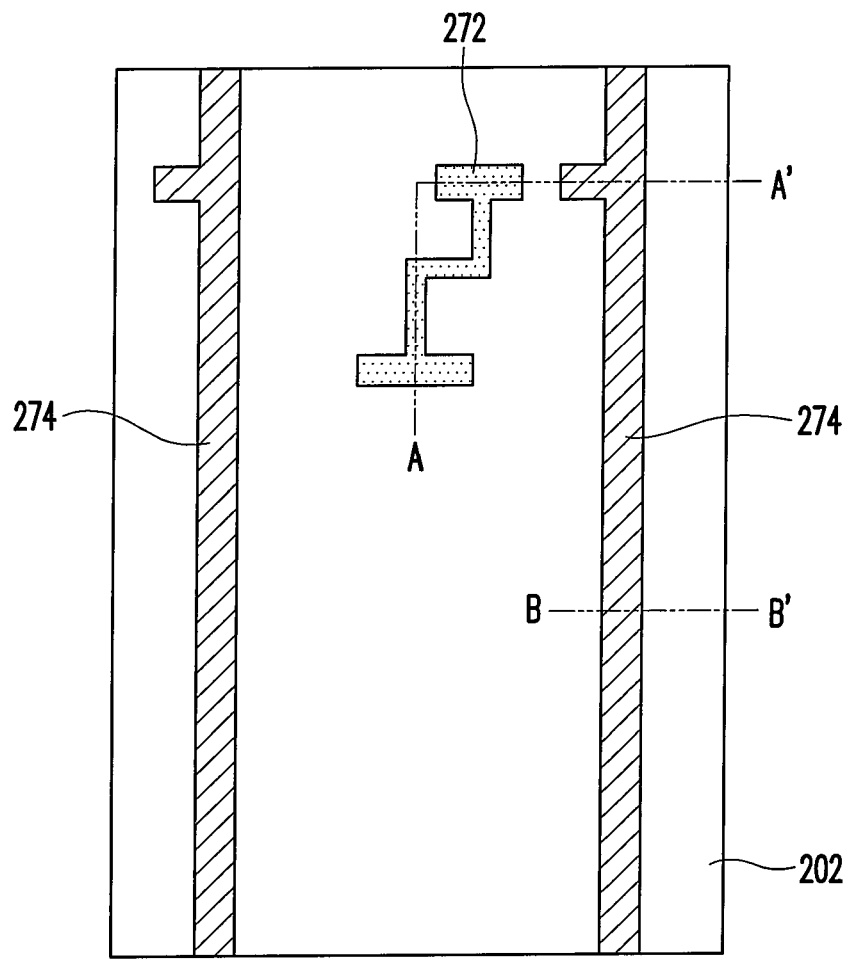
Figure 2E:
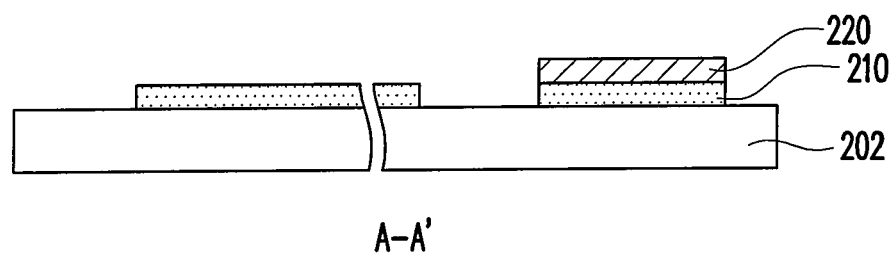
Figure 2E:
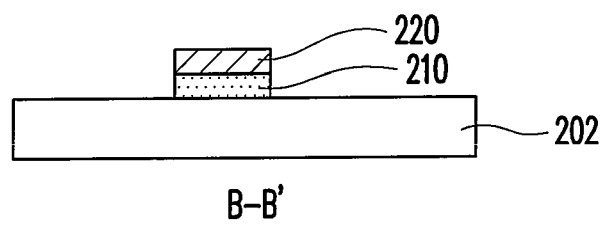

More particularly, in this embodiment, the semiconductor pattern 272 and the data line pattern 274 are formed through a half-tone mask (or a grey-tone mask) process, and the detailed steps are, for example, as shown in FIG. 2B. Firstly, a photoresist material layer 510 is formed on the first conductive layer 220, then the photoresist material layer 510 is patterned to form a first photoresist pattern 512 and a second photoresist pattern 514, wherein the method of patterning the photoresist material layer 510 is, for example, performing a lithography process on the photoresist material layer 510 through the half-tone mask or the grey-tone mask. The first photoresist pattern 512 formed by the step corresponds to the position of the subsequently formed semiconductor pattern 272, the second photoresist pattern 514 corresponds to the position of the subsequently formed data line pattern 274, and the thickness of the first photoresist pattern 512 is smaller than that of the second photoresist pattern 514. Next, as shown in FIG. 2C, the semiconductor layer 210 and the first conductive layer 220 are etched by using the first photoresist pattern 512 and the second photoresist pattern 514 as a mask, so as to remove the first conductive layer 220 and the semiconductor layer 210 exposed by the first photoresist pattern 512 and the second photoresist pattern 514. Then, as shown in FIG. 2D, an ashing process is performed on the first photoresist pattern 512 and the second photoresist pattern 514, wherein the etched thickness of the photoresist material layer 510 in the ashing process is controlled to fully remove the first photoresist pattern 512, and to remove a portion of the second photoresist pattern 514. At this time, the first conductive layer 220 previously covered by the first photoresist pattern 512 is exposed. Then, as shown in FIG. 2E, the semiconductor layer 210 and the first conductive layer 220 are etched by using the remained second photoresist pattern 514 as a mask, so as to remove the first conductive layer 220 exposed by the second photoresist pattern 514 to expose the corresponding semiconductor layer 210. Then, the remained second photoresist pattern 514 is removed to form the semiconductor pattern 272 and the data line pattern 274 having different thicknesses.

Figure 2F:
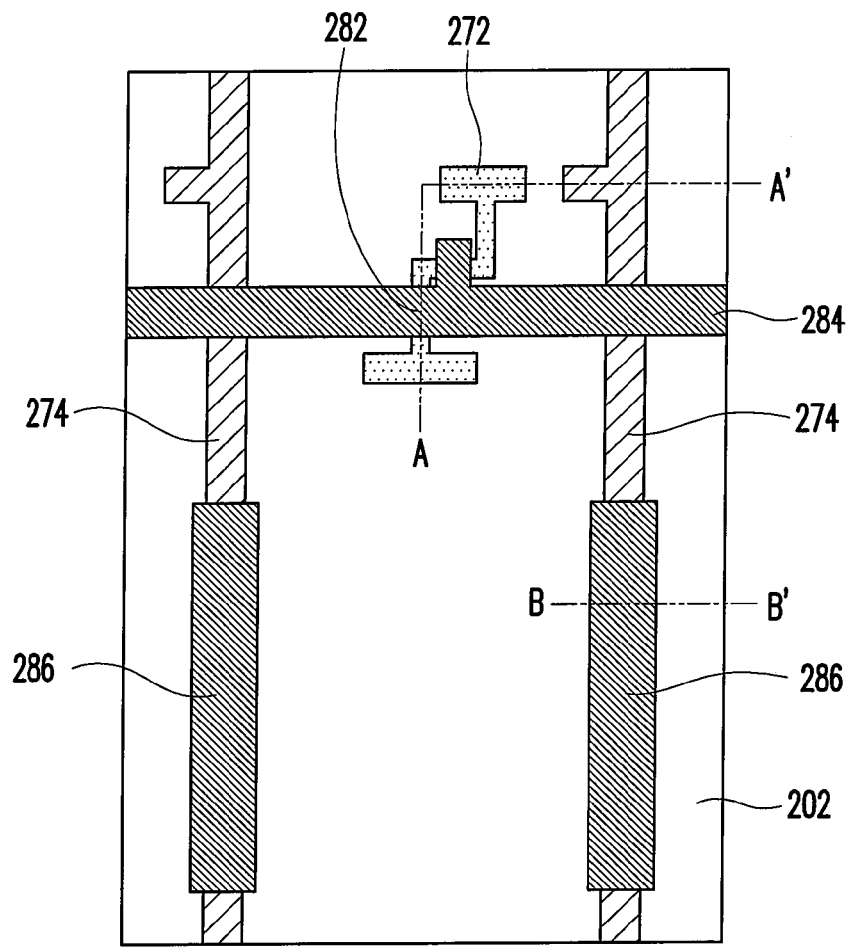
Figure 2F:
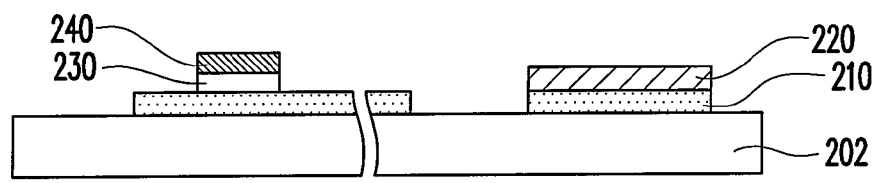
Figure 2F:
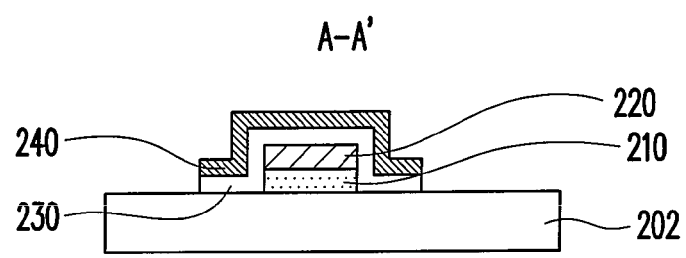

Then, as shown in FIG. 2F, a gate insulation layer 230 and a second conductive layer 240 are formed on the substrate in sequence, and the gate insulation layer 230 and the second conductive layer 240 are patterned to form a gate pattern 282 and a scan line pattern 284 connected to each other, wherein the gate pattern 282 and the scan line pattern 284 are respectively composed of the gate insulation layer 230 and the second conductive layer 240. In addition, the gate pattern 282 is located on the semiconductor pattern 272, and exposes a portion of the semiconductor pattern 272, and the exposed portion of the semiconductor pattern 272 is located on two sides of the gate pattern 282. In addition, this embodiment can further form a first electrode pattern 286 on the data line pattern 274 when patterning the gate insulation layer 230 and the second conductive layer 240. The first electrode pattern 286 is also composed of the gate insulation layer 230 and the second conductive layer 240, wherein a storage capacitor structure can be formed from the first electrode pattern 286 and by the subsequent steps. The thickness of the gate insulation layer 230 is, for example, 500 Å to 1500 Å, and the material is, for example, silicon nitride, silica, or a combination thereof. The material of the second conductive layer 240 includes metal and alloy, such as aluminum, titanium/aluminum/titanium, titanium/molybdenum/titanium, molybdenum, molybdenum/aluminum/molybdenum, and moly-tungsten, or combinations thereof.

Then, as shown in FIGS. 2G-2J, a source region 272s, a drain region 272d, a channel region 272c, and a lightly doped region 272k required to form the TFT are formed in the semiconductor pattern 272. The source region 272s and the drain region 272d are respectively located on two sides of the gate pattern 282, the channel region 272c is located under the gate pattern 282, and the lightly doped region 272k is located between the channel region 272c and the source region 272s and between the channel region 272c and the drain region 272d.

Figure 2G:
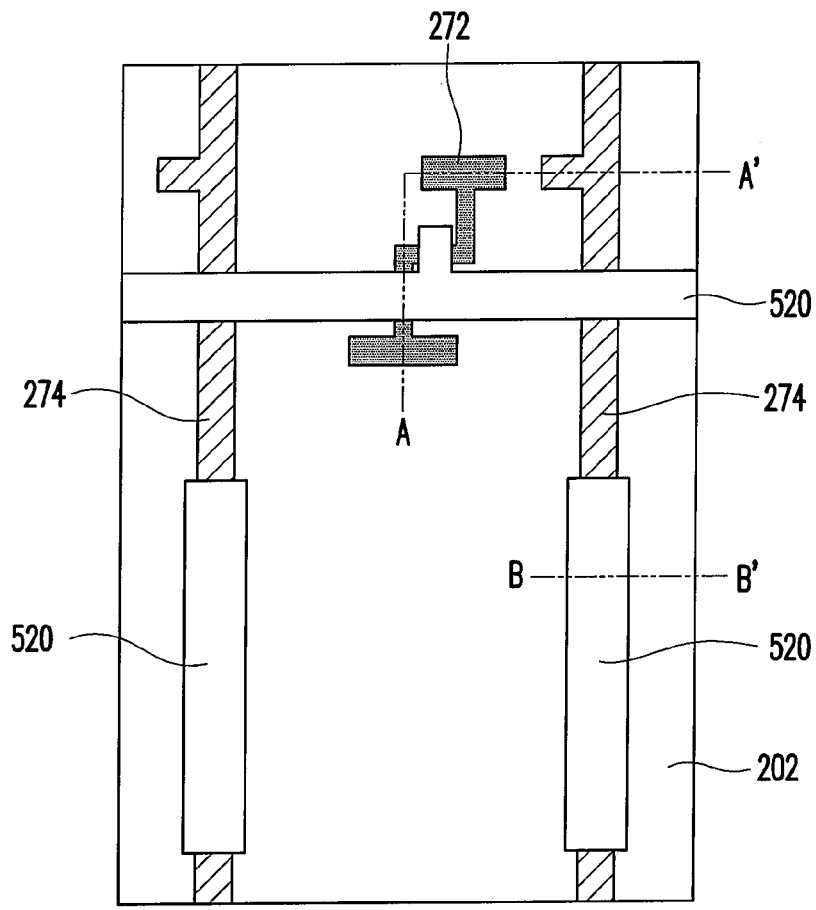
Figure 2G:
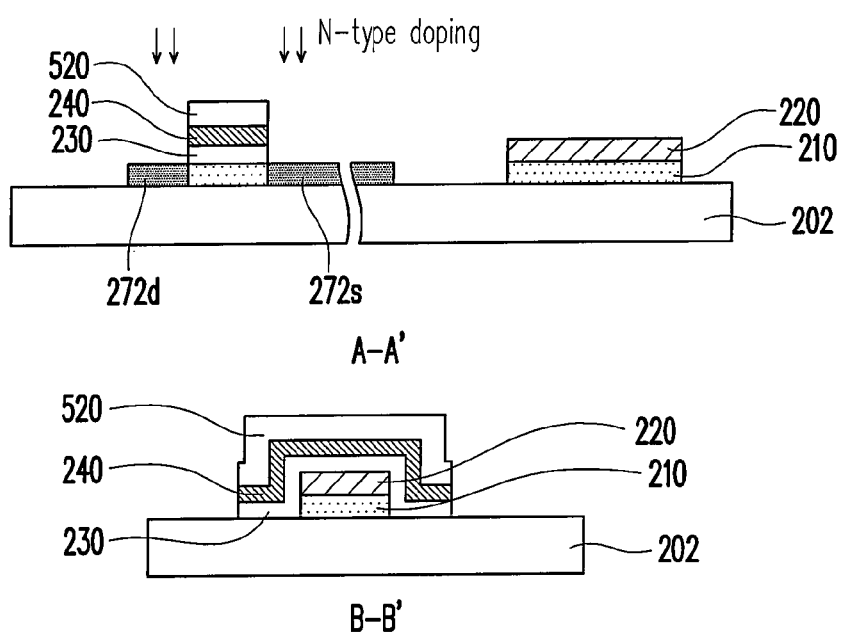

More particularly, the process is as shown in FIG. 2G. Firstly, a photoresist pattern 520 is left or additionally formed on the gate pattern 282 after patterning the gate insulation layer 230 and the second conductive layer 240. In this embodiment, the photoresist pattern 520 further covers the scan line pattern 284 and the first electrode pattern 286. A first ion doping is performed on the semiconductor pattern 272 by using the photoresist pattern 520 and the gate pattern 282 as a mask, so as form the source region 272s and the drain region 272d. The first ion doping performed here is, for example, an N-type doping. In other embodiments, the first ion doping can also be a P-type doping.

Figure 2H:
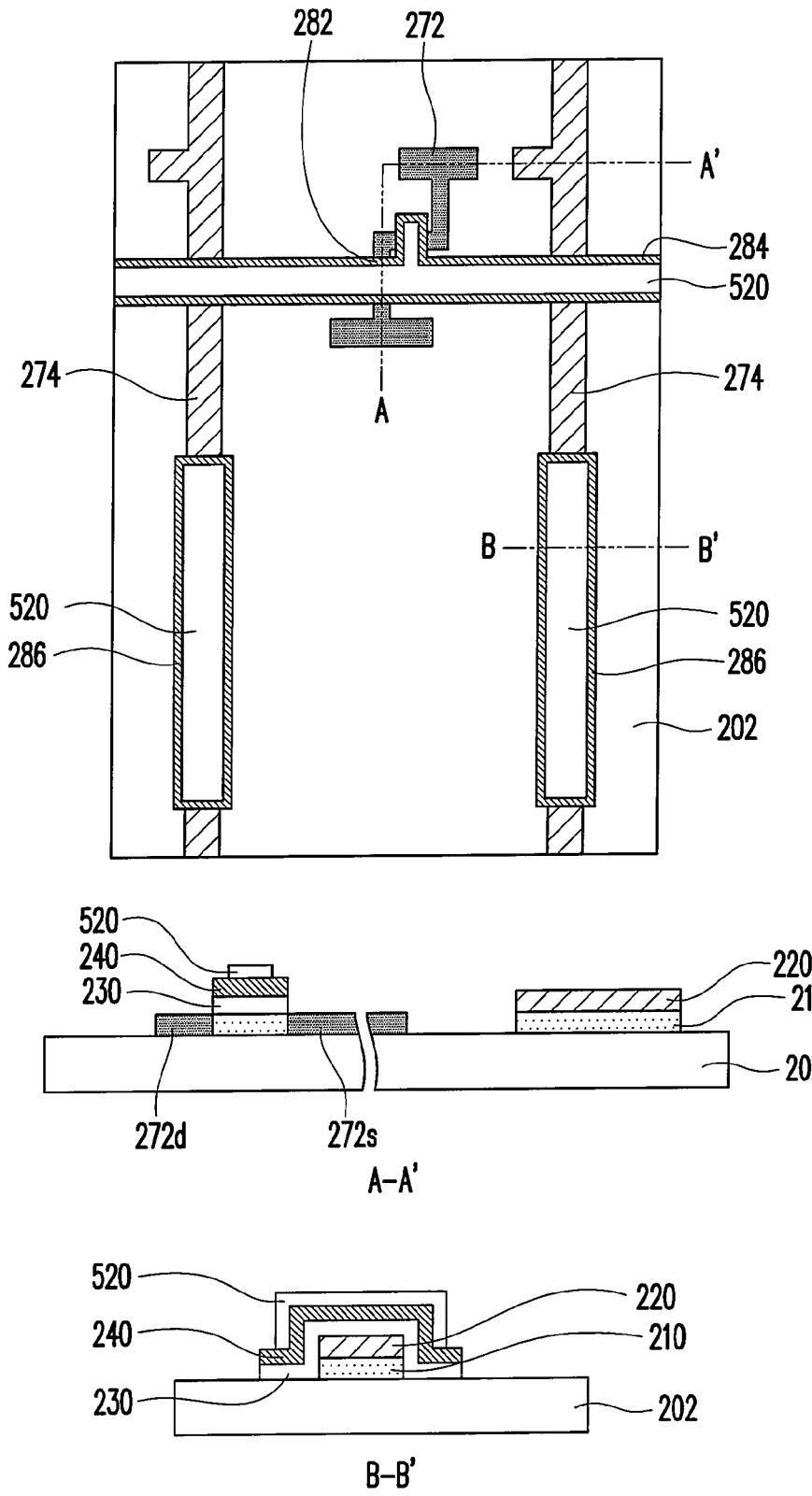

Then, as shown in FIG. 2H, an ashing process is performed on the photoresist pattern 520, so as to remove a portion of the photoresist pattern 520, such that the photoresist pattern 520 exposes a portion of the gate pattern 282. In this embodiment, the photoresist pattern 520 can further simultaneously expose a portion of the scan line pattern 284 and the first electrode pattern 286. Since the ashing process is an isotropic etching process, the two sides of the photoresist pattern 520 may equally shrink inwards, so as to expose the same lengths of the gate pattern 282, the scan line pattern 284, and the first electrode pattern 286. In other words, in this step, the mask is not used, and the self-alignment effect can be achieved without performing any mask alignment, so as to prevent the problem of misalignment of the mask when the lightly doped region is fabricated in the conventional art, and thereby achieve a preferred process yield.

Figure 2I:
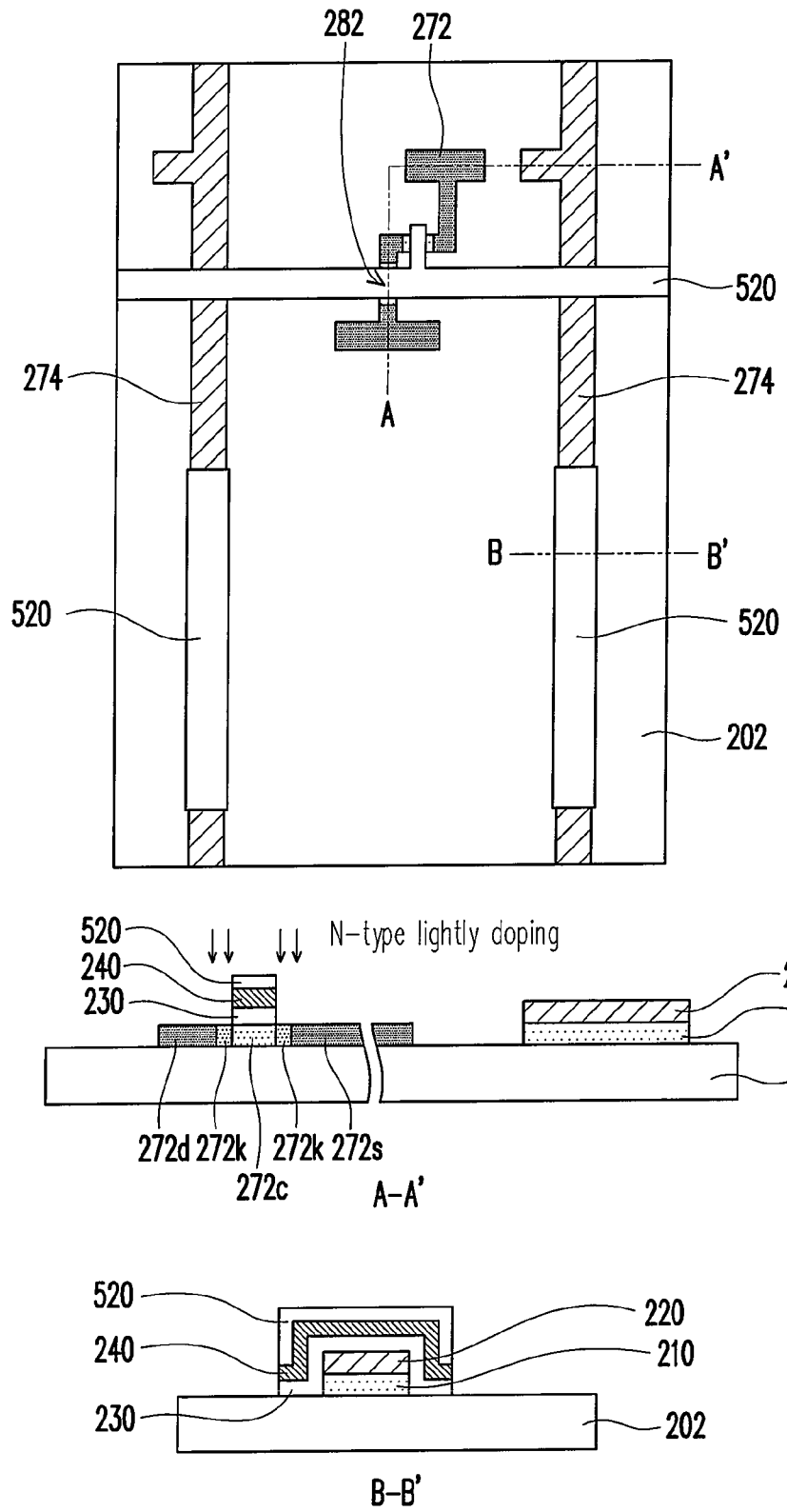

Then, as shown in FIG. 2I, the exposed gate pattern 282 is etched by using the ashed photoresist pattern 520 as a mask, such that the gate pattern 282 further exposes the other part of the semiconductor pattern 272 that is not doped. A second ion doping is performed on the exposed undoped semiconductor pattern 272 by using the gate pattern 282 as a mask, wherein the second ion doping is a light ion doping for forming the lightly doped region 272k, and defining the channel region 272c. It should be noted that if in the above step, the source region 272s and the drain region 272d are formed by means of N-type doping, the light ion doping in the step should also adopt the N-type doping. Similarly, if in the above step, the source region 272s and the drain region 272d are formed by means of P-type doping, the light ion doping in the step also should adopt the P-type doping.

Figure 2J:
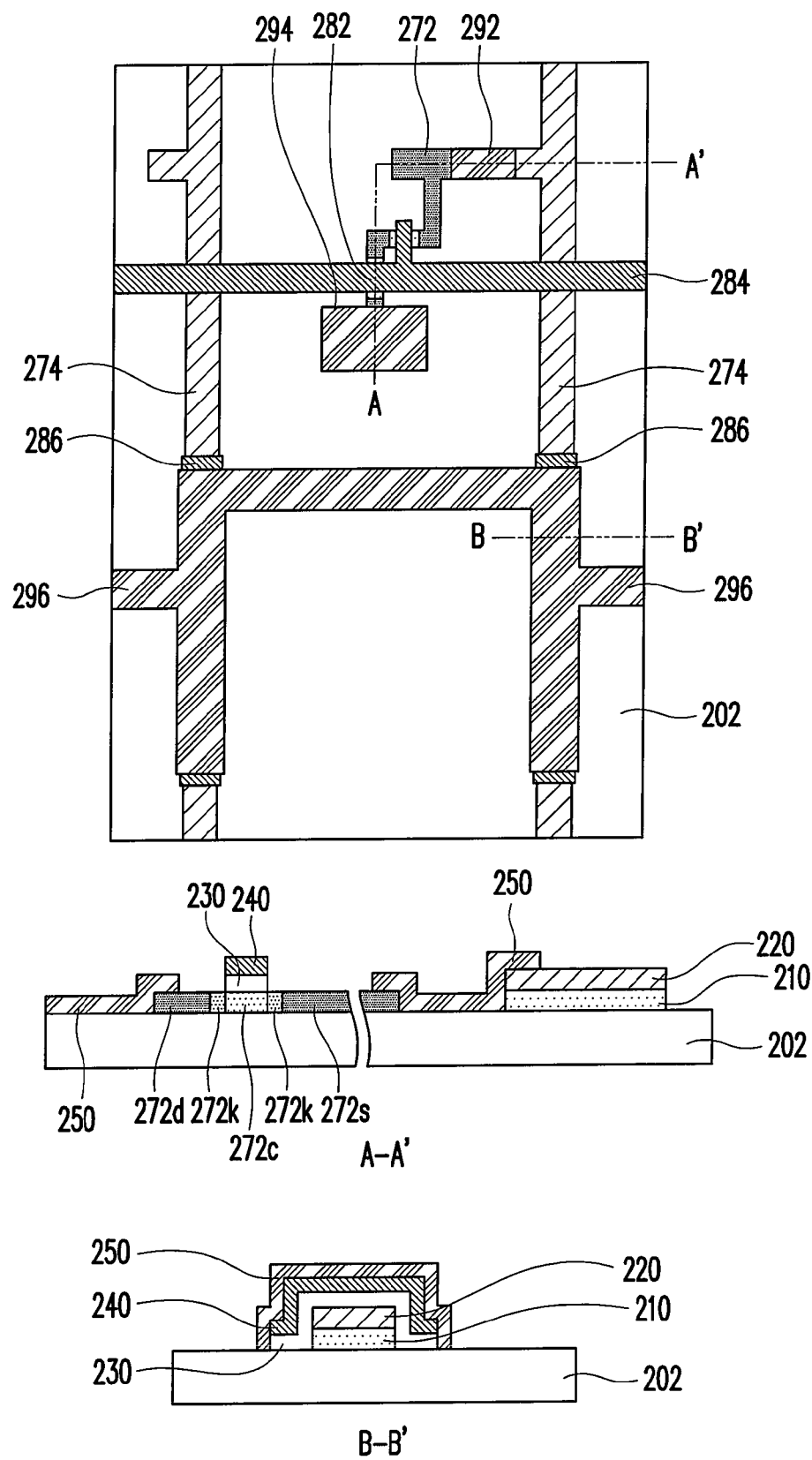

Then, as shown in FIG. 2J, the photoresist pattern 520 is removed to form a third conductive layer 250 on the substrate 202, and the third conductive layer 250 is patterned to form a source pattern 292 and a drain pattern 294. The source pattern 292 and the drain pattern 294 are respectively located on two sides of the gate pattern 282, and respectively connected to the source region 272s and the drain region 272d. The source pattern 292 is further electrically connected to the data line pattern 274. In addition, in order to fabricate the storage capacitor structure, a common line pattern 296 is further formed when patterning the third conductive layer 250, wherein a portion of the common line pattern 296 is located on the first electrode pattern 286. The material of the third conductive layer 250 includes, for example, molybdenum, molybdenum/aluminum/molybdenum, aluminum, titanium/aluminum/titanium, or combinations thereof.

Figure 2K:
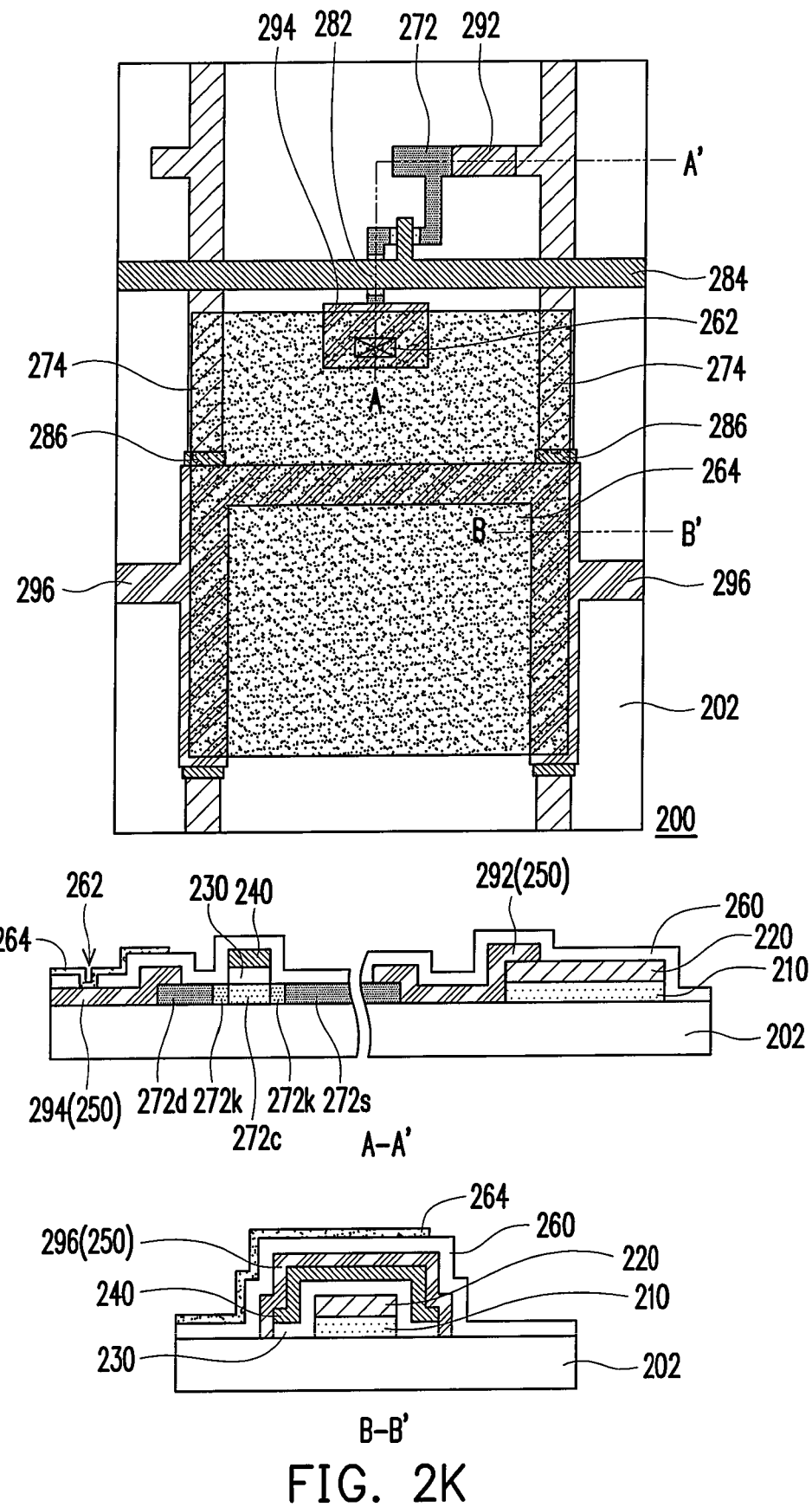

Then, as shown in FIG. 2K, a protective layer 260 is fully formed on the substrate, and the protective layer 260 is patterned to form a contact window 262 for exposing the drain pattern 294. A pixel electrode 264 is formed on the protective layer 260, wherein the pixel electrode 264 is electrically connected to the drain pattern 294 through the contact window 262. In order to make the drawing relatively clear, the top view of FIG. 2K does not show the protective layer 260, and only shows the outline of the contact window 262. In this embodiment, the thickness of the protective layer 260 is, for example, 2000 Å to 8000 Å, or approximately 2000 Å to 6000 Å preferably. In addition, the material of the pixel electrode 264 is, for example, transparent conductive material such as indium tin oxide and indium zinc oxide. Until now, the fabrication of the pixel structure 200 is substantially finished, and the first electrode pattern 286, the common line pattern 296, the protective layer 260, and the pixel electrode 264 can form the storage capacitor structure.

In view of the above, the fabrication method of the pixel structure according to the above embodiment mainly uses the half-tone mask or the grey-tone mask process technology to simultaneously define the semiconductor pattern and the data line. The self-alignment method is adopted to fabricate the lightly doped region having symmetric lengths on two sides of the channel region through steps such as photoresist ashing and etching, so as to effectively avoid the problem of the misalignment of the mask when defining the lightly doped region in the conventional art. In addition, in the above process, the source pattern and the drain pattern are made to directly contact the source region and the drain region of the semiconductor pattern, such that a process of fabricating via is omitted. On the whole, more simplified process steps are provided, so as to improve the process throughput. In the other aspect, the common line pattern formed by the above embodiment surrounds the peripheral of the pixel, that is, the storage capacitor is disposed on the peripheral of the pixel, thereby lowering the loss of the aperture ratio of the pixel resulted from the disposition of the storage capacitor, and thus improving the display quality of the pixel.

Second Embodiment

FIGS. 3A to 3K illustrate a fabrication method of a pixel structure according to the second embodiment of the present invention. Each drawing shows a top view and a sectional view along line A-A' of the related structure. Under the possible situation, in order to clearly represent the content of the drawing, the numerals in the top views of FIG. 3A to FIG. 3K are used to mark the patterns defined in the process, and the numerals in the sectional views of FIG. 3A to FIG. 3K are used to mark the material film layers forming the patterns.

A part of the process in this embodiment is similar to that of the above embodiment, and the processing method and the film layer material adopted by the above embodiment can be applied in this embodiment, so these are not repeatedly described in this embodiment.

Figure 3A:
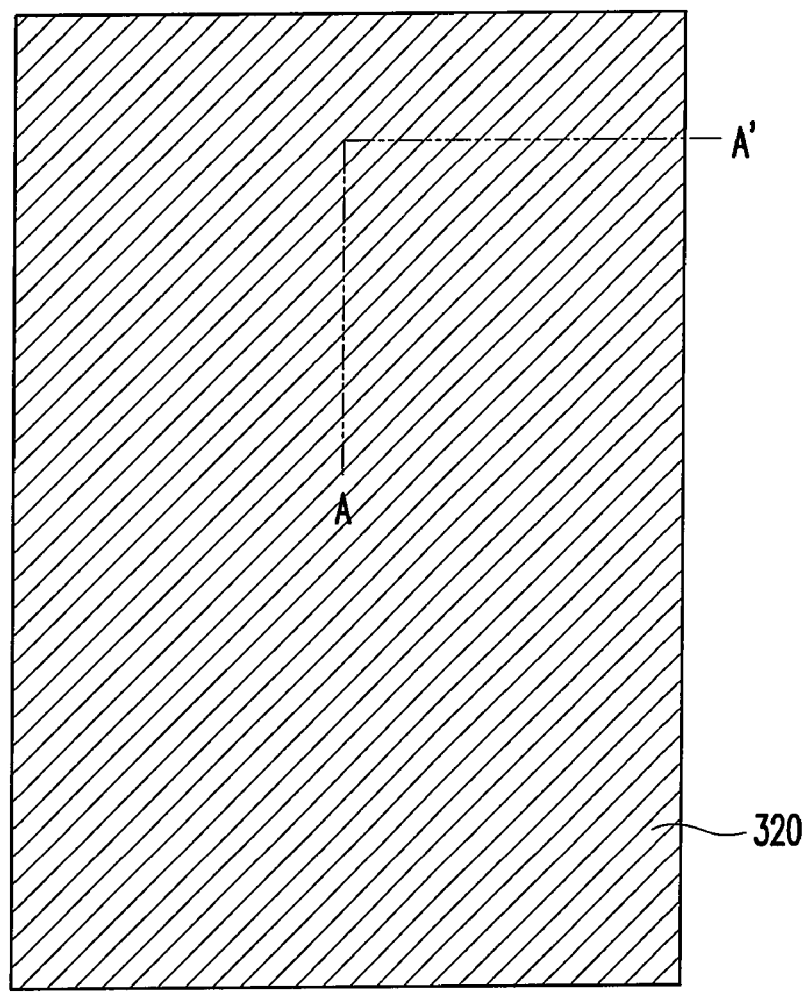
FIGS. 3A to 3K illustrate a fabrication method of a pixel structure according to a second embodiment of the present invention.
Figure 3A:
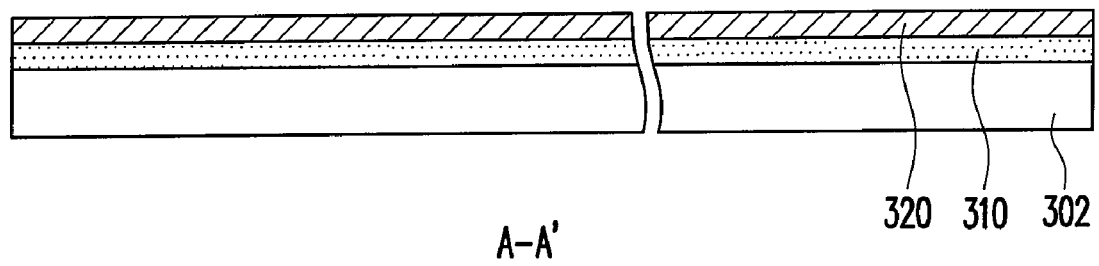

For the fabrication method of the pixel structure of this embodiment, firstly, as shown in FIG. 3A, a substrate 302 is provided, and a semiconductor layer 310 and a first conductive layer 320 are formed on the substrate 302 in sequence. Then, as shown in FIGS. 3B-3E, the semiconductor layer 310 and the first conductive layer 320 are patterned to form a semiconductor pattern 372 and a data line pattern 374 having different thicknesses, wherein the semiconductor pattern 372 is composed of the semiconductor layer 310, and the data line pattern 374 is composed of the semiconductor layer 310 and the first conductive layer 320. In addition, this embodiment can further form a first electrode pattern 376 when patterning the semiconductor layer 310 and the first conductive layer 320. The first electrode pattern 376 is also composed of the semiconductor layer 310 and the first conductive layer 320, wherein a storage capacitor structure can be formed from the first electrode pattern 376 and by the subsequent steps.

Figure 3B:
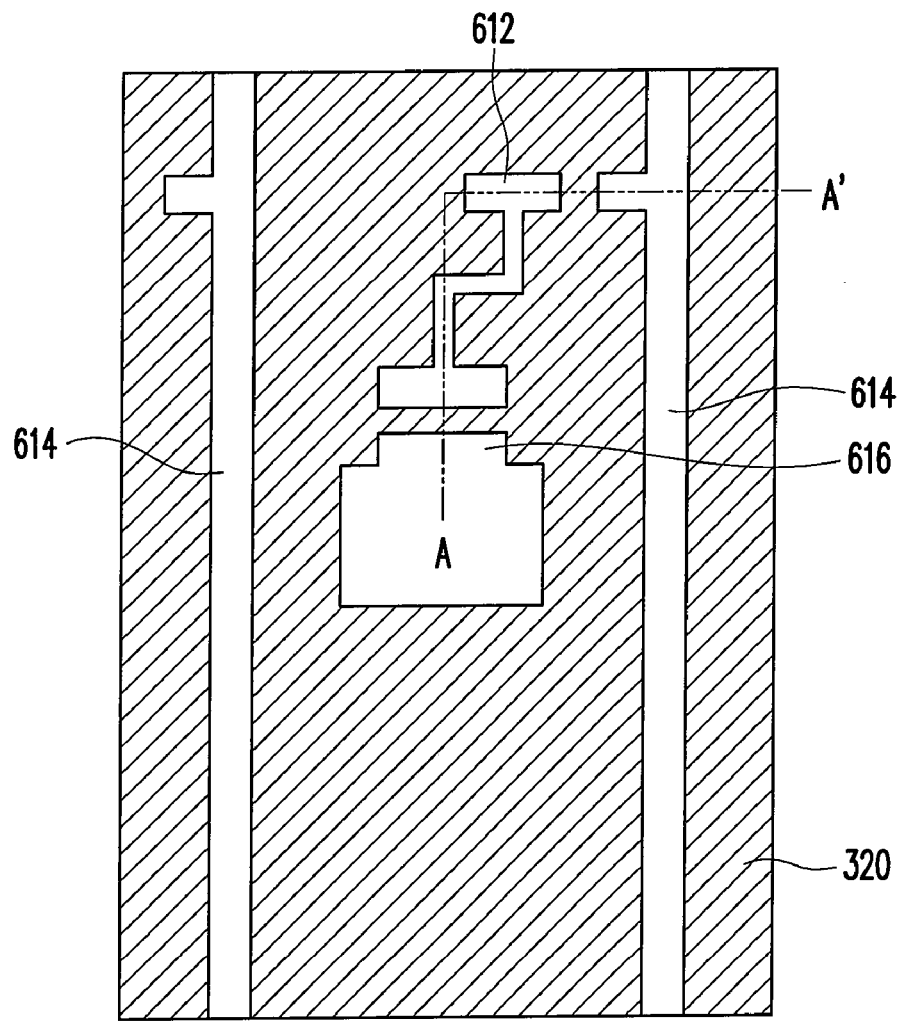
Figure 3B:
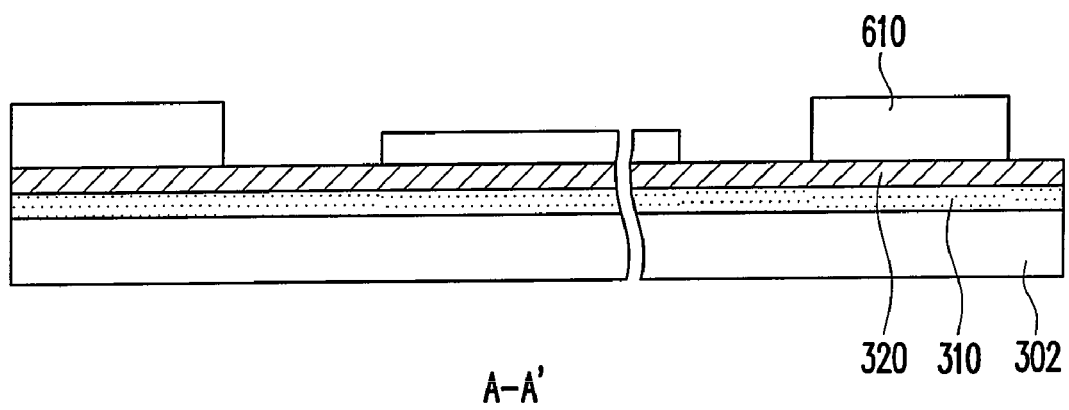
Figure 3C:
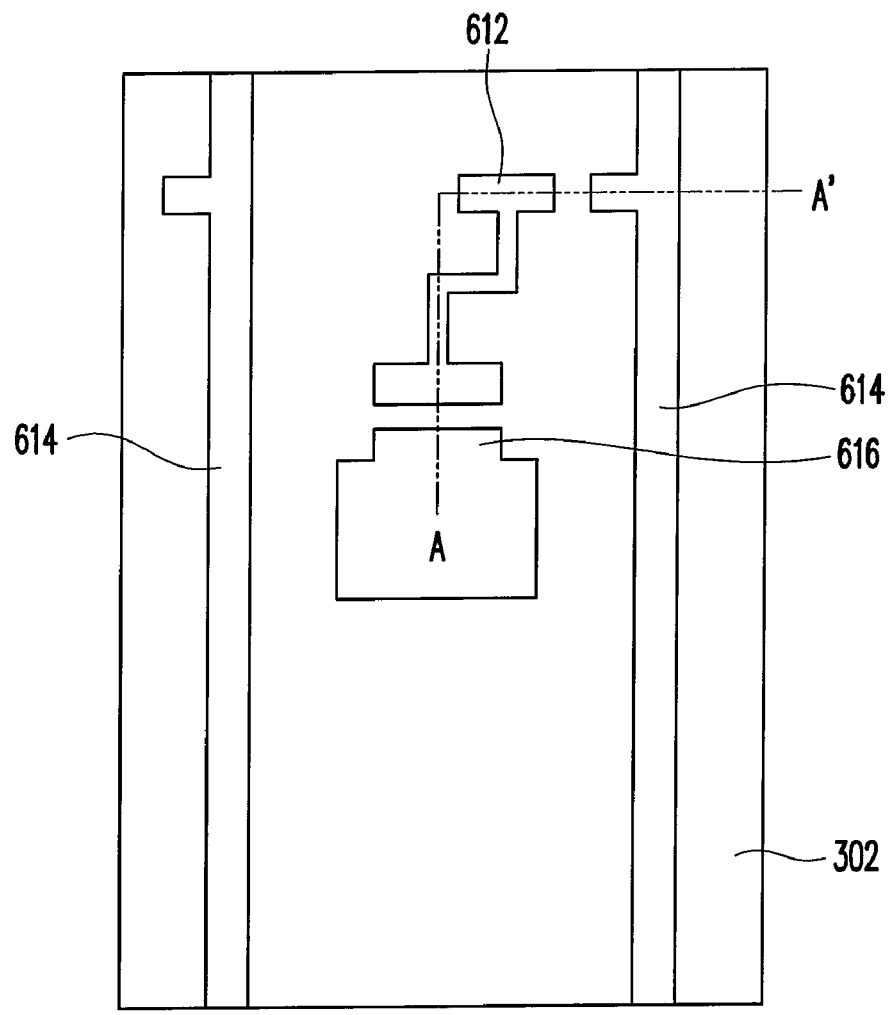
Figure 3C:
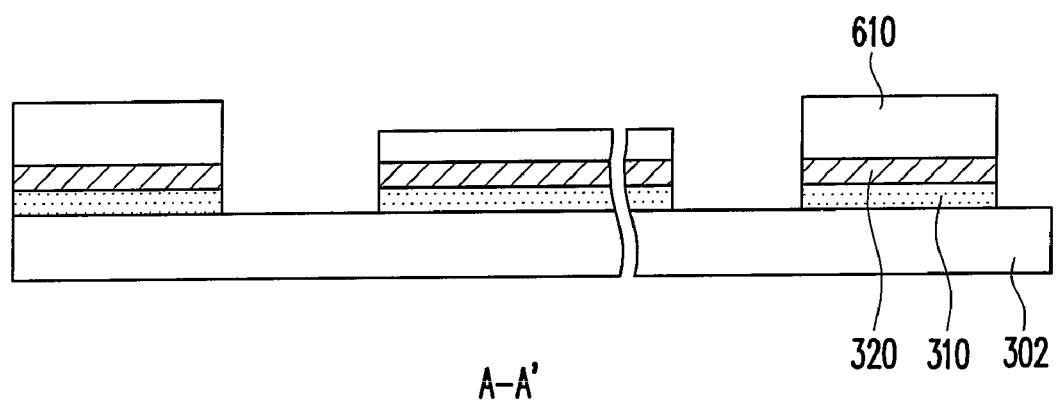
Figure 3D:
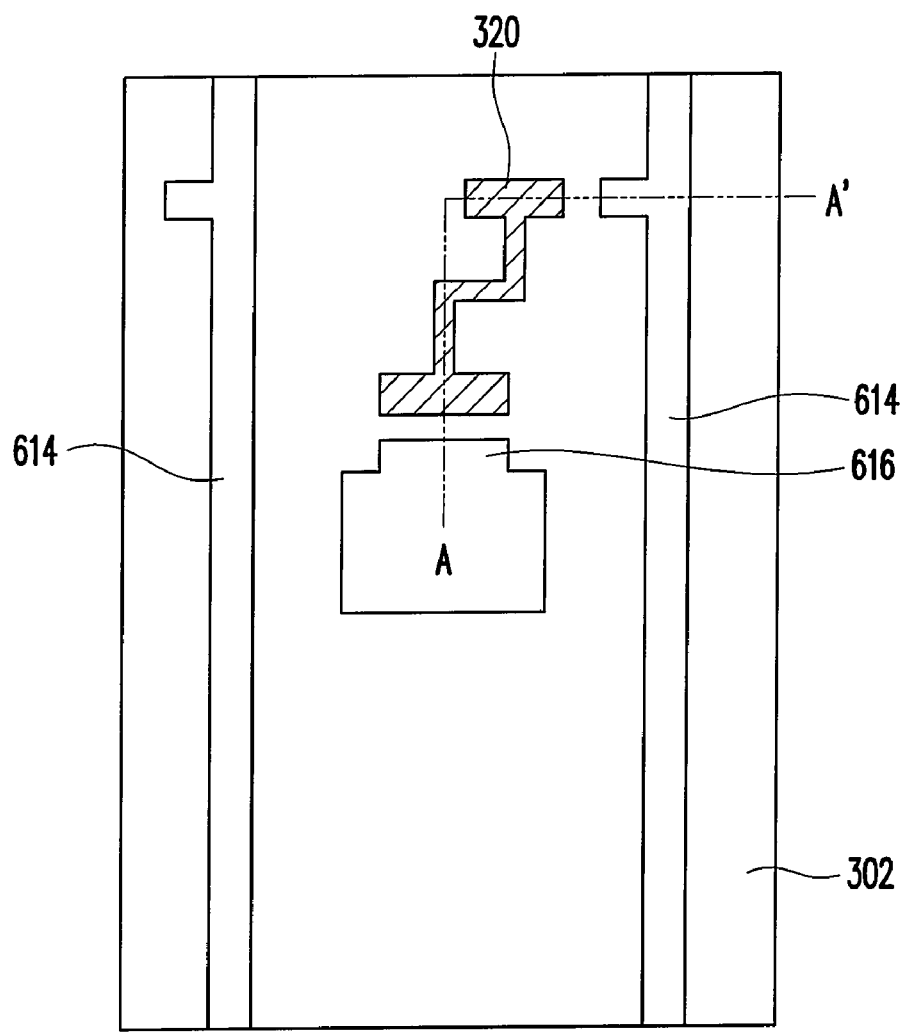
Figure 3D:
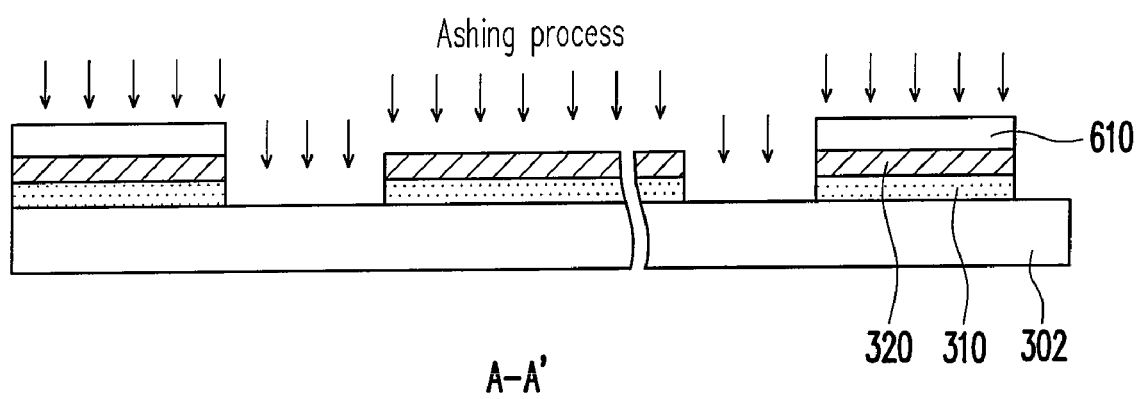
Figure 3E:
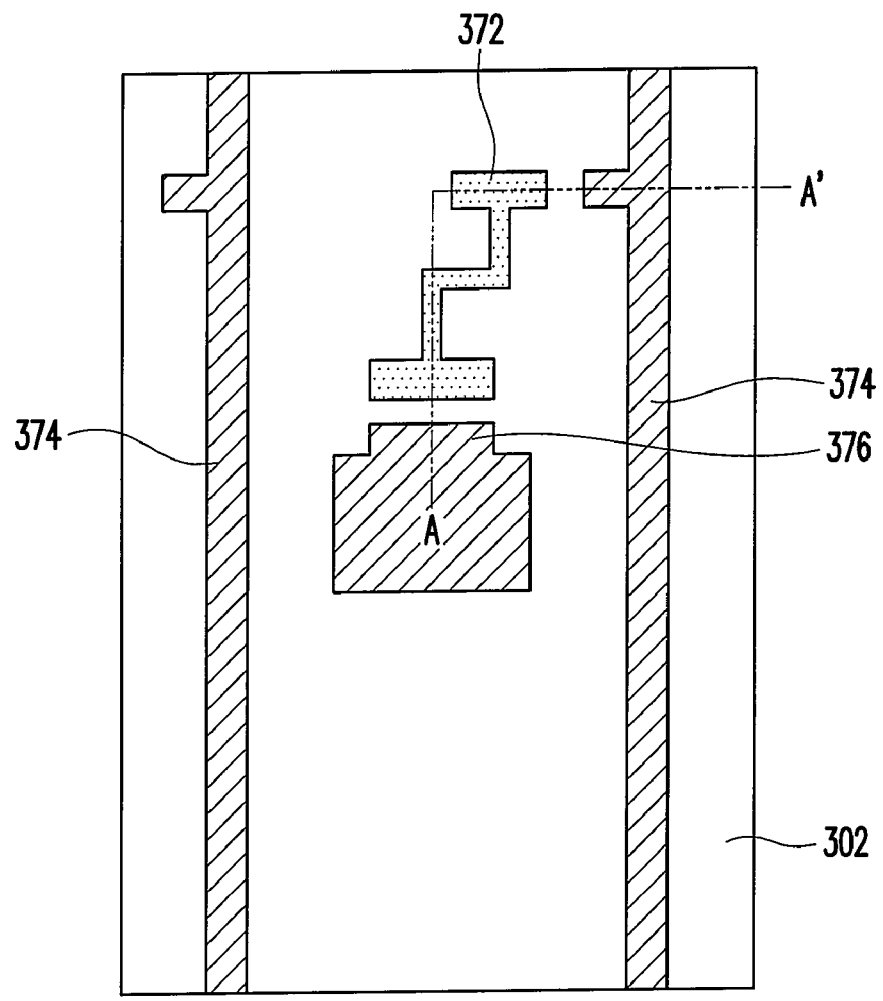
Figure 3E:
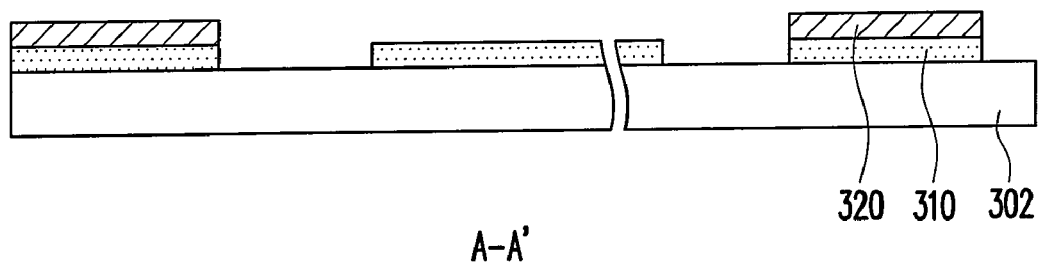

More particularly, in this embodiment, the semiconductor pattern 372, the data line pattern 374, and the first electrode pattern 376 are formed by using a half-tone mask (or a greytone mask) process, and the detailed steps are, for example, shown in FIG. 3B. Firstly, a photoresist material layer 610 is formed on the first conductive layer 320, then the photoresist material layer 610 is patterned to form a first photoresist pattern 612, a second photoresist pattern 614, and a third photoresist pattern 616, wherein the method of patterning the photoresist material layer 610 is, for example, performing a lithography process on the photoresist material layer 610 by means of half-tone mask or grey-tone mask. The first photoresist pattern 612 formed by the step corresponds to the position of the subsequently formed semiconductor pattern 372, the second photoresist pattern 614 corresponds to the position of the subsequently formed data line pattern 374, the third photoresist pattern 616 corresponds to the position of the subsequently formed first electrode pattern 376, and the thickness of the first photoresist pattern 612 is smaller than the thickness of the second photoresist pattern 614 and the third photoresist pattern 616. Next, as shown in FIG. 3C, the semiconductor layer 310 and the first conductive layer 320 are etched by using the first photoresist pattern 612, the second photoresist pattern 614, and the third photoresist pattern 616 as a mask, so as to remove the first conductive layer 320 and the semiconductor layer 310 exposed by the first photoresist pattern 612, the second photoresist pattern 614, and the third photoresist pattern 616. Then, as shown in FIG. 3D, an ashing process is performed on the first photoresist pattern 612, the second photoresist pattern 614, and the third photoresist pattern 616, wherein the etched thickness of the photoresist material layer 610 in the ashing process is controlled to fully remove the first photoresist pattern 612, and to remove a portion of the second photoresist pattern 614 and the third photoresist pattern 616. At this time, the first conductive layer 320 previously covered by the first photoresist pattern 612 is exposed. Then, as shown in FIG. 3E, the semiconductor layer 310 and the first conductive layer 320 are etched by using the remained second photoresist pattern 614 as a mask, so as to remove the first conductive layer 320 exposed by the second photoresist pattern 614 and the third photoresist pattern 616, thereby exposing the corresponding semiconductor layer 310. Then, the remained second photoresist pattern 614 and third photoresist pattern 616 are removed to form the semiconductor pattern 372, the data line pattern 374, and the first electrode pattern 376 having different thicknesses.

Figure 3F:
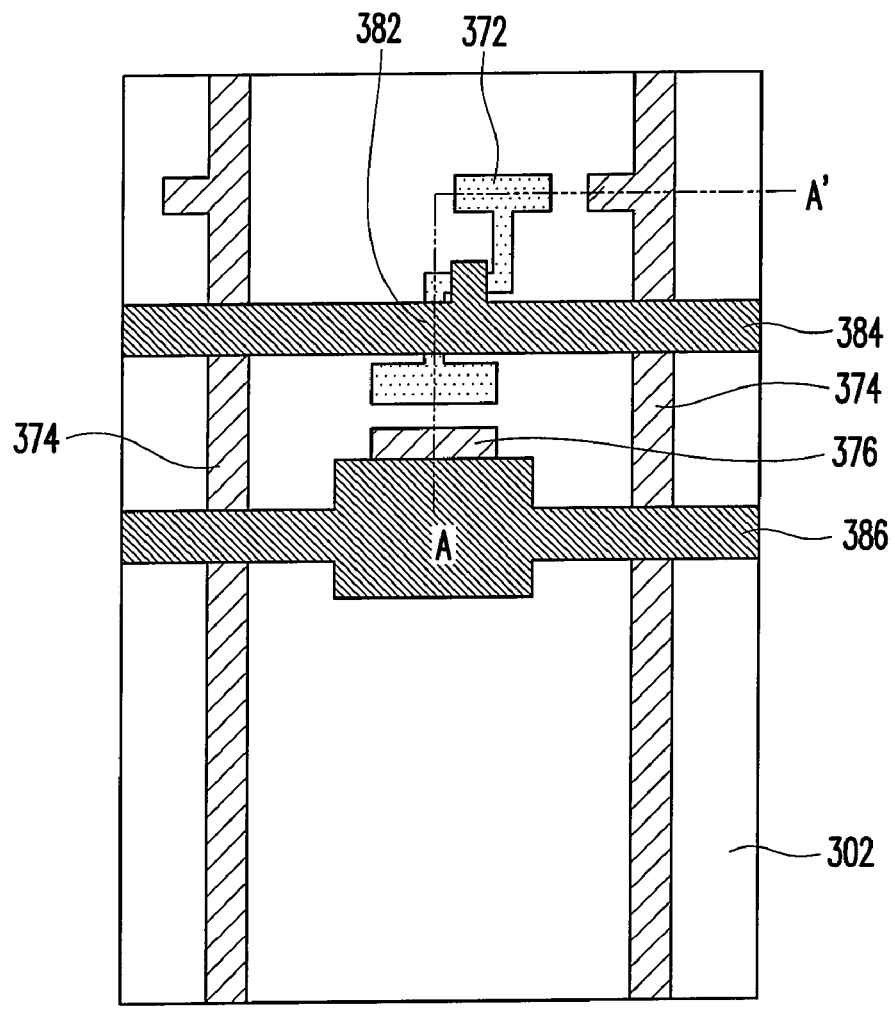
Figure 3F:
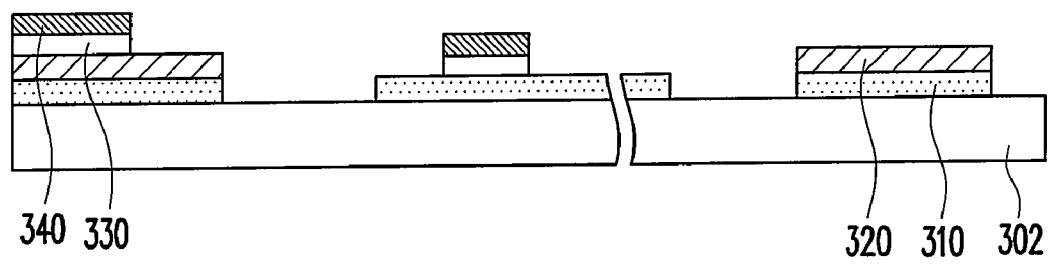

Next, as shown in FIG. 3F, a gate insulation layer 330 and a second conductive layer 340 are formed on the substrate in sequence, and the gate insulation layer 330 and the second conductive layer 340 are patterned to form a gate pattern 382, a scan line pattern 384, and a common line pattern 386 connected together. The gate pattern 382, the scan line pattern 384, and the common line pattern 386 are respectively composed of the gate insulation layer 330 and the second conductive layer 340. The gate pattern 382 is located on the semiconductor pattern 372, and exposes a portion of the semiconductor pattern 372, and the exposed portion of the semiconductor pattern 372 is located on two sides of the gate pattern 382. The common line pattern 386 is located on the first electrode pattern 376 and is joined with the first electrode pattern 376, so as to form the storage capacitor structure together with the subsequent steps.

Then, as shown in FIGS. 3G-3J, a source region 372s, a drain region 372d, a channel region 372c, and a lightly doped region 372k required to form the TFT are formed in the semiconductor pattern 372. The source region 372s and the drain region 372d are respectively located on two sides of the gate pattern 382, the channel region 372c is located under the gate pattern 382, and the lightly doped region 372k is located between the channel region 372c and the source region 372s and between the channel region 372c and the drain region 372d.

Figure 3G:
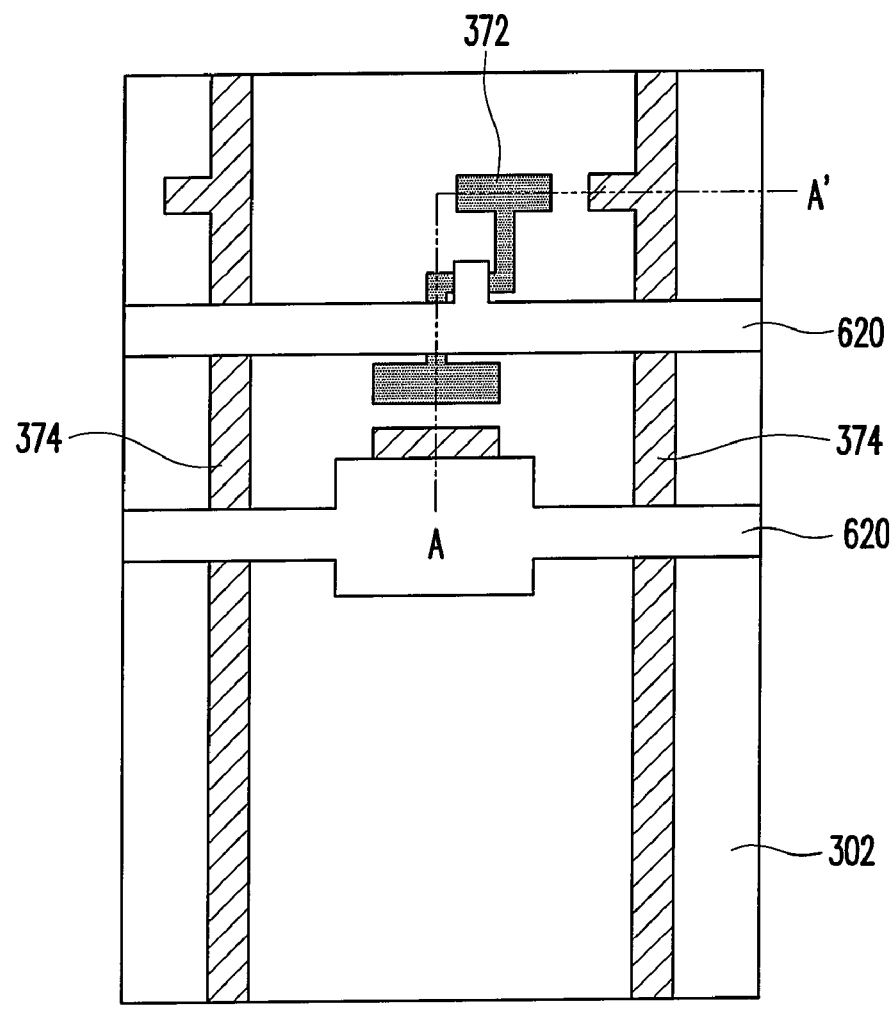
Figure 3G:
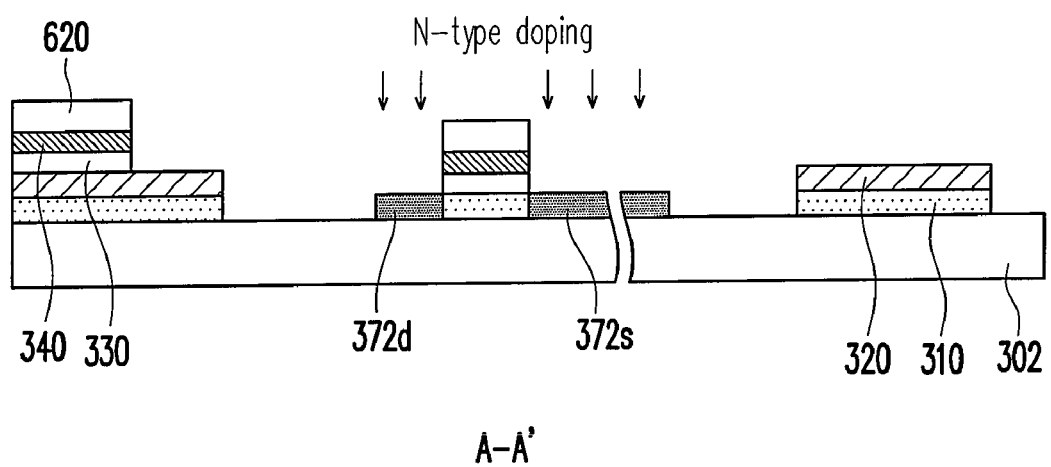

More particularly, the process is as shown in FIG. 3G. Firstly, a photoresist pattern 620 is left or additionally formed on the gate pattern 382 after patterning the gate insulation layer 330 and the second conductive layer 340. In this embodiment, the photoresist pattern 620 further covers the scan line pattern 384 and the common line pattern 386. A first ion doping is performed on the semiconductor pattern 372 by using the photoresist pattern 620 and the gate pattern 382 as a mask, so as form the source region 372s and the drain region 372d. The first ion doping performed here is, for example, an N-type doping, definitely, in other embodiment, the first ion doping can also be a P-type doping.

Figure 3H:
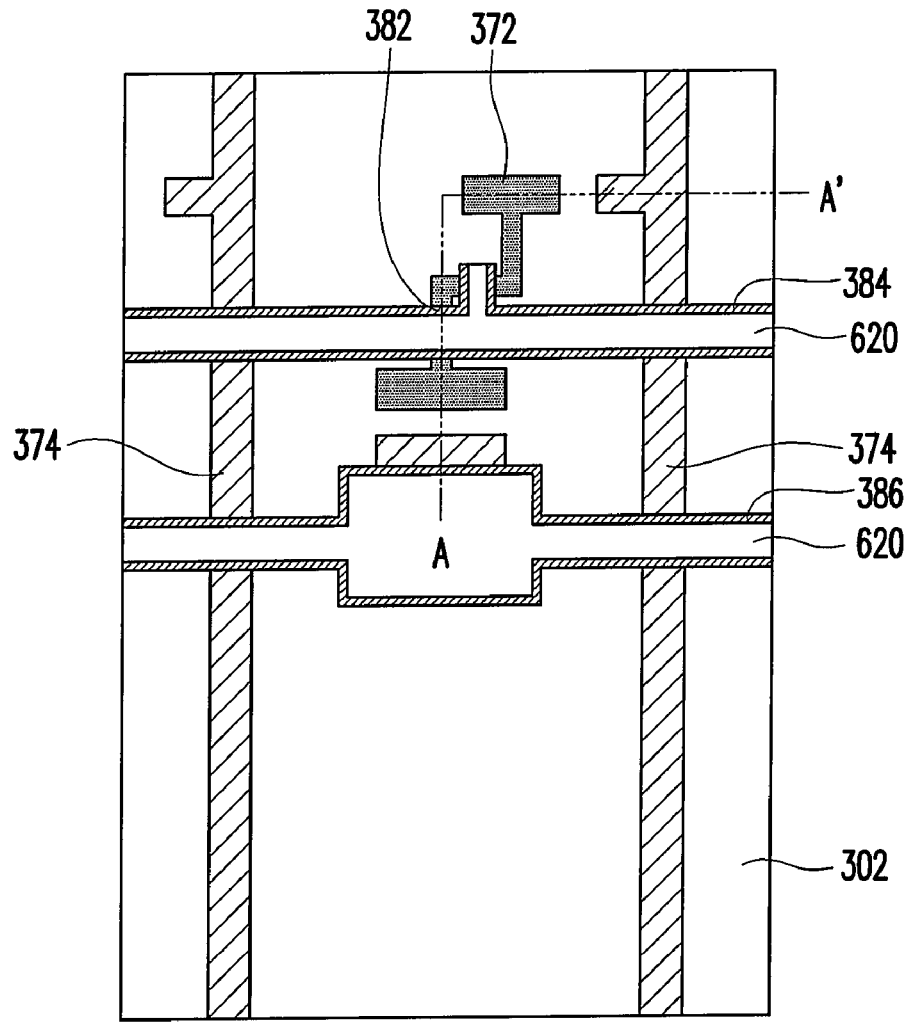
Figure 3H:
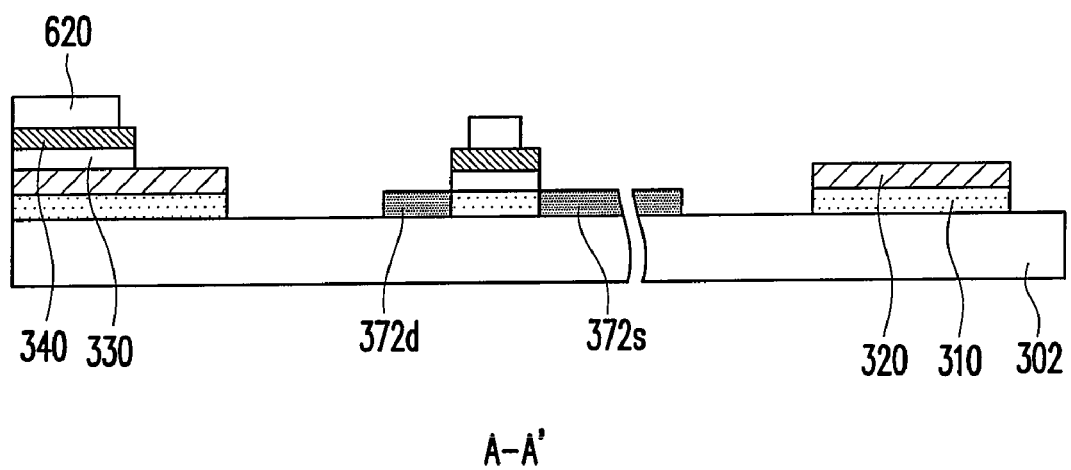

Then, as shown in FIG. 3H, the ashing process is performed on the photoresist pattern 620, so as to remove a portion of the photoresist pattern 620, such that the photoresist pattern 620 exposes a portion of the gate pattern 382. In this embodiment, the photoresist pattern 620 can further simultaneously expose a portion of the scan line pattern 384 and the common line pattern 386. Since the ashing process is an isotropic etching process, the two sides of the photoresist pattern 620 may equally shrink inwards, so as to expose the same lengths of the gate pattern 382, the scan line pattern 384, and the common line pattern 386. In other words, in the step, the mask is not used, and the self-alignment effect can be achieved without performing any mask alignment, so as to prevent the problem of misalignment of the mask when the lightly doped region is fabricated in the conventional art, and thereby achieve a preferred process yield.

Figure 3I:
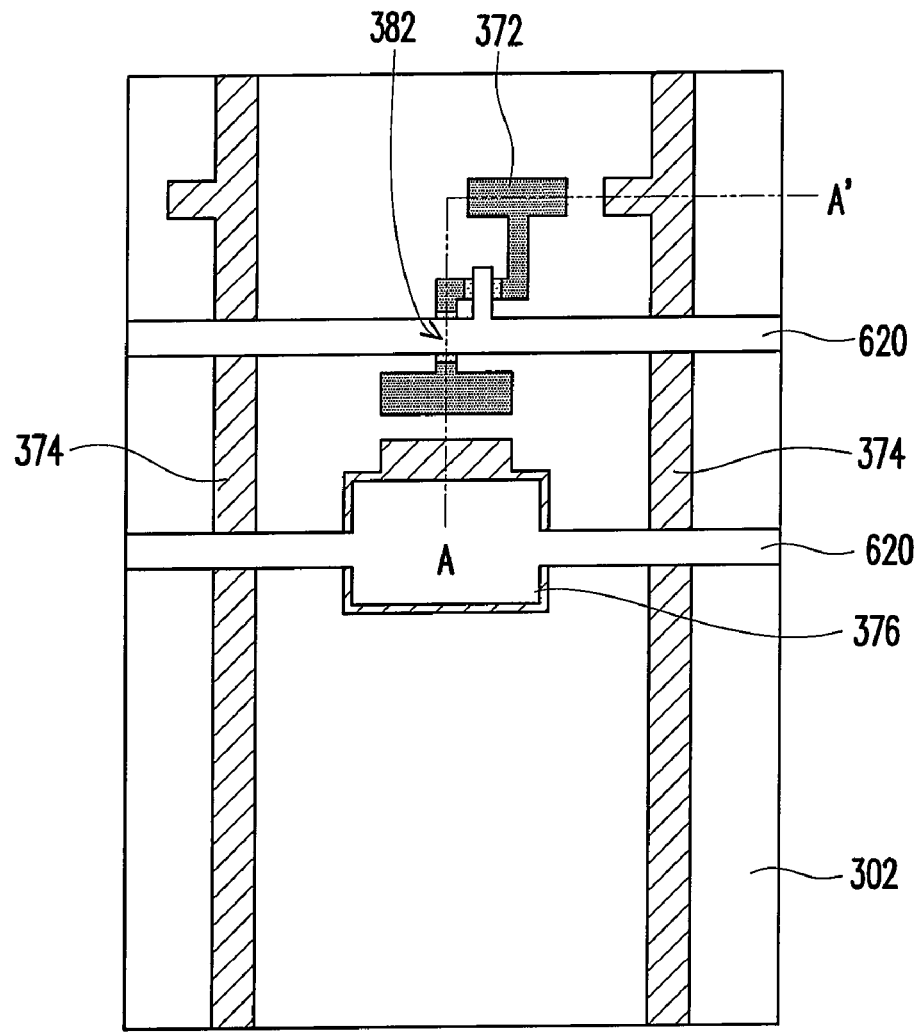
Figure 3I:
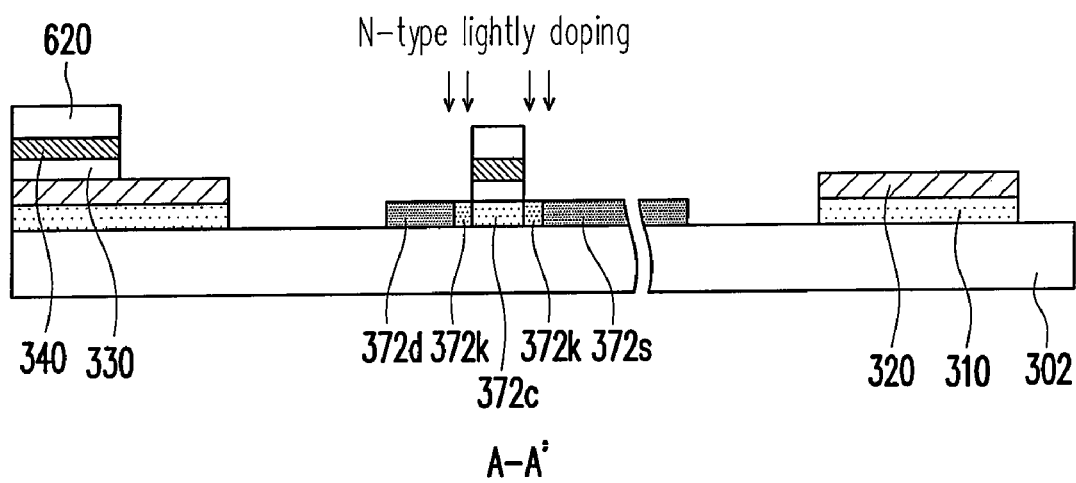

Then, as shown in FIG. 3I, the exposed gate pattern 382 is etched by using the ashed photoresist pattern 620 as a mask, such that the gate pattern 382 further exposes the other portion of the semiconductor pattern 372 that is not doped. A second ion doping is performed on the exposed undoped semiconductor pattern 372 by using the gate pattern 382 as a mask, wherein the second ion doping is a light ion doping for forming the lightly doped region 372k, and defining the channel region 372c. It should be noted that if in the above step, the source region 372s and the drain region 372d are formed by means of N-type doping, the light ion doping in the step should also adopt the N-type doping. Similarly, if in the above step, the source region 372s and the drain region 372d are formed by means of P-type doping, the light ion doping in the step also should adopt the P-type doping.

Figure 3J:
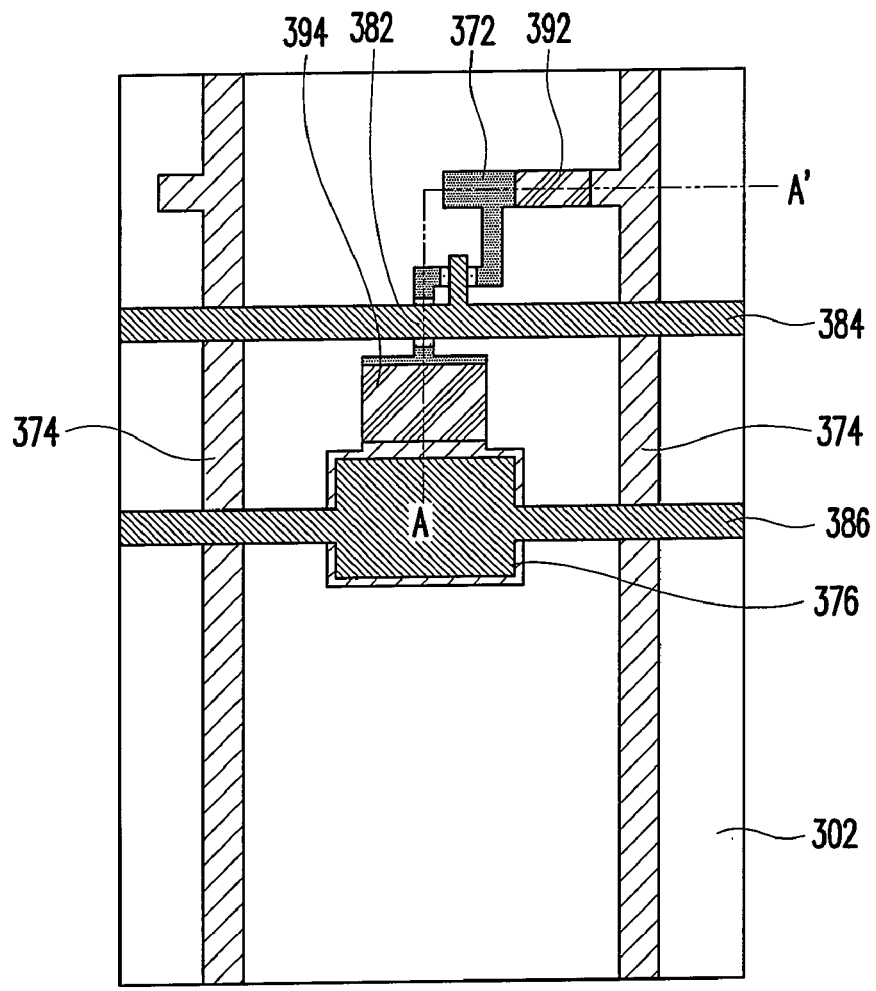
Figure 3J:
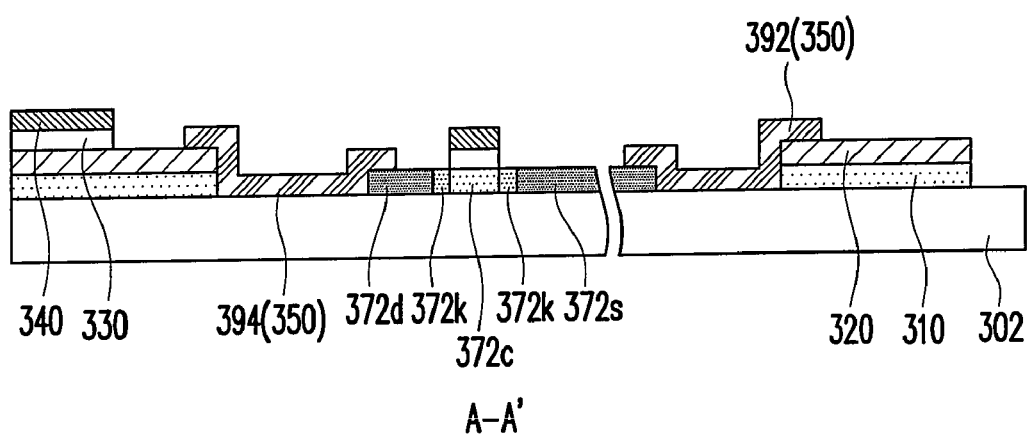

Then, as shown in FIG. 3J, the photoresist pattern 620 is removed to form a third conductive layer 350 on the substrate 302, and the third conductive layer 350 is patterned to form a source pattern 392 and a drain pattern 394. The source pattern 392 and the drain pattern 394 are respectively located on two sides of the gate pattern 382, and respectively connected to the source region 372s and the drain region 372d. The source pattern 392 is further electrically connected to the data line pattern 374, and the drain pattern 394 is further electrically connected to the first electrode pattern 376.

Figure 3K:
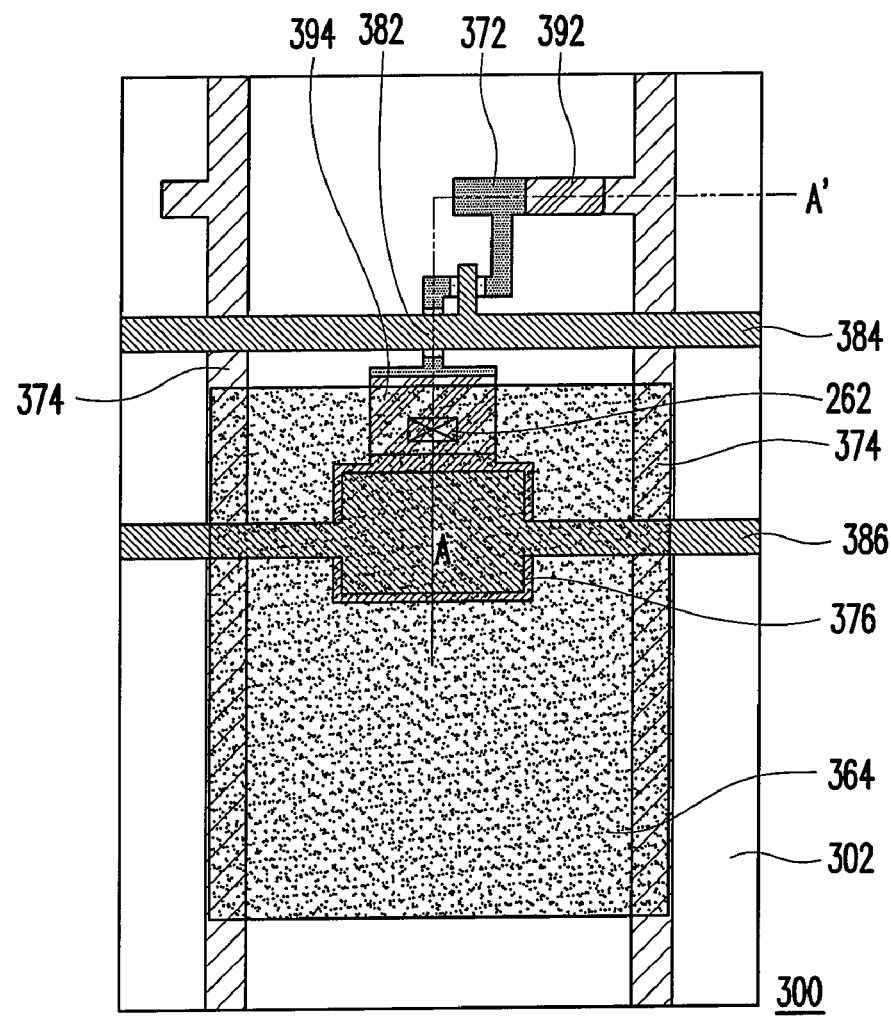
Figure 3K:
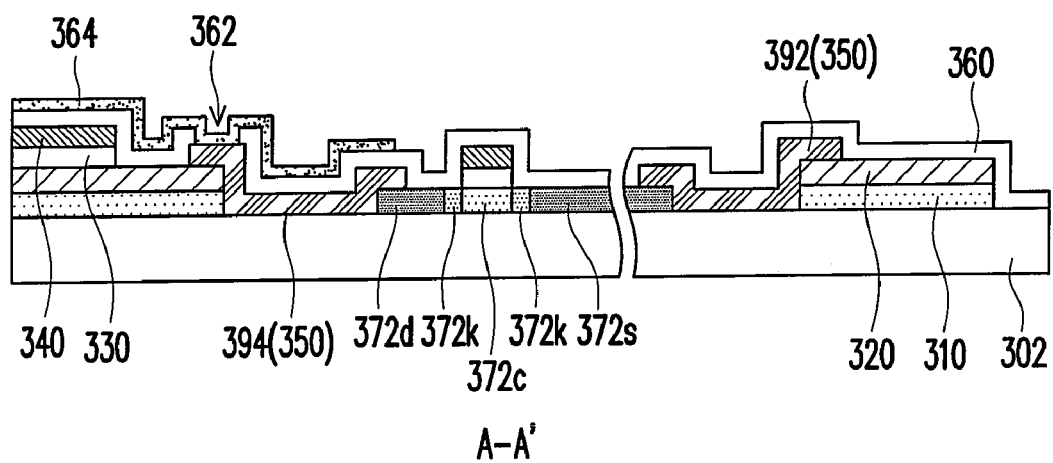

Then, as shown in FIG. 3K, a protective layer 360 is fully formed on the substrate, and the protective layer 360 is patterned to form a contact window 362 for exposing the drain pattern 394. A pixel electrode 364 is formed on the protective layer 360, wherein the pixel electrode 364 is electrically connected to the drain pattern 394 through the contact window 362. In order to make the drawing relatively clear, the top view of FIG. 3K does not show the protective layer 360, and only shows the outline of the contact window 362. Until now, the fabrication of the pixel structure 300 is substantially finished, and the first electrode pattern 376, the common line pattern 386, the protective layer 360, and the pixel electrode 364 can form the storage capacitor structure.

Similarly, the fabrication method of the pixel structure of the embodiment mainly uses the half-tone mask or the grey-tone mask process technology to simultaneously define the semiconductor pattern and the data line. The self-alignment method is adopted to fabricate the lightly doped region having symmetric lengths on two sides of the channel region through steps such as photoresist ashing and etching, so as to effectively avoid the problem of the misalignment of the mask when defining the lightly doped region in the conventional art. In addition, the source pattern and the drain pattern are made to directly contact the source region and the drain region of the semiconductor pattern, such that a process of fabricating via is omitted. On the whole, the more simplified process steps are provided, so as to improve the process throughput.

To sum up, as compared with the conventional art, the pixel structure and the fabrication method thereof provided by the present invention has the advantages of simple process and high yield, so as to save the process time and lower the production cost. In addition, specific storage capacitor designs can be matched to improve the aperture ratio of the pixel structure and to further enhance the display quality of pixel.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure, comprising:
a substrate;
a semiconductor pattern and a data line, formed on the substrate, wherein the semiconductor pattern has a source region, a drain region, a channel region, and a lightly doped region, the source region and the drain region are respectively located on two sides of the channel region, and the lightly doped region is located between the channel region and the source region and between the channel region and the drain region;
a scan line, formed on the substrate, and located above the data line;
a gate pattern, formed on the semiconductor pattern, and electrically connected to the scan line;
a gate insulation layer, located between the gate pattern and the semiconductor pattern;
a source pattern and a drain pattern, respectively disposed on two sides of the gate pattern, and respectively electrically connected to the source region and the drain region, wherein the source pattern is further electrically connected to the data line;
a protective layer, disposed on the substrate to cover the semiconductor pattern, the data line, the scan line, the gate pattern, the source pattern, and the drain pattern, and having a contact window for exposing the drain pattern; and
a pixel electrode, disposed on the protective layer, and electrically connected to the drain pattern through the contact window.

2. The pixel structure as claimed in claim 1, wherein the material of the semiconductor pattern comprises poly-silicon.

3. The pixel structure as claimed in claim 1, wherein the source region and the drain region are an N-type doped region or a P-type doped region.

4. The pixel structure as claimed in claim 1, wherein the lightly doped region is an N-type doped region or a P-type doped region.

5. The pixel structure as claimed in claim 1, further comprising a first electrode pattern located on the data line.

6. The pixel structure as claimed in claim 5, further comprising a common line pattern, wherein a portion of the common line pattern is located on the first electrode pattern and wherein the common line pattern is located on a peripheral region of the pixel electrode.

7. The pixel structure as claimed in claim 1, further comprising a first electrode pattern located on a display region of the pixel electrode.

8. The pixel structure as claimed in claim 7, further comprising a common line pattern, wherein a portion of the common line pattern is located on the first electrode pattern.

9. The pixel structure as claimed in claim 1, wherein the thickness of the gate insulation layer is approximately 500 Å to 1500 Å.

10. The pixel structure as claimed in claim 1, wherein the material of the gate pattern comprises aluminum, titanium/aluminum/titanium, titanium/molybdenum/titanium, molybdenum, molybdenum/aluminum/molybdenum, moly-tungsten, or a combination thereof.

11. The pixel structure as claimed in claim 1, wherein the material of the source pattern and the drain pattern comprises molybdenum, molybdenum/aluminum/molybdenum, titanium/aluminum/titanium, or a combination thereof.

* * * * *